(12) United States Patent
Kim et al.

(10) Patent No.: US 11,887,936 B2
(45) Date of Patent: Jan. 30, 2024

(54) SEMICONDUCTOR DEVICE INCLUDING ALIGNMENT KEY, ELECTRONIC SYSTEM, AND METHOD OF FORMING THE SAME

(71) Applicant: SAMSUNG ELECTRONICS CO., LTD., Suwon-si (KR)

(72) Inventors: Kwanyong Kim, Uijeongbu-si (KR); Sungwon Shin, Hwaseong-si (KR); Seungmin Lee, Seoul (KR); Juyoung Lim, Seoul (KR); Wonseok Cho, Suwon-si (KR)

(73) Assignee: Samsung Electronics Co., Ltd.

( * ) Notice: Subject to any disclaimer, the term of this patent is extended or adjusted under 35 U.S.C. 154(b) by 145 days.

(21) Appl. No.: 17/469,952

(22) Filed: Sep. 9, 2021

(65) Prior Publication Data

US 2022/0302041 A1    Sep. 22, 2022

(30) Foreign Application Priority Data

Mar. 22, 2021    (KR) .................. 10-2021-0036514

(51) Int. Cl.
*H01L 23/544*    (2006.01)
*H01L 23/532*    (2006.01)
(Continued)

(52) U.S. Cl.
CPC ........ *H01L 23/544* (2013.01); *H01L 23/5283* (2013.01); *H01L 23/53295* (2013.01); *H10B 41/46* (2023.02)

(58) Field of Classification Search
CPC ... H01L 2223/54426; H01L 2223/5446; H01L 2225/06541; H01L 23/5226;
(Continued)

(56) References Cited

U.S. PATENT DOCUMENTS 10,403,766 B2    9/2019    Rhie
10,418,374 B2    9/2019    Lee et al.
(Continued)

FOREIGN PATENT DOCUMENTS

CN    111326526 A    6/2020
KR    20070096605 A    10/2007
(Continued)

*Primary Examiner* — Nicholas J Tobergte
*Assistant Examiner* — Kevin Quinto
(74) *Attorney, Agent, or Firm* — Fish & Richardson P.C.

(57) ABSTRACT

A semiconductor device includes a first stack structure on a substrate, and a second stack structure on the first stack structure. A channel structure extends through the first stack structure and the second stack structure. A first auxiliary stack structure including a plurality of first insulating layers and a plurality of first mold layers are alternately stacked on the substrate. An alignment key extends into the first auxiliary stack structure and protrudes to a higher level than an uppermost end of the first stack structure. A second auxiliary stack structure is disposed on the first auxiliary stack structure and the alignment key, and includes a plurality of second insulating layers and a plurality of second mold layers alternately stacked. The second auxiliary stack structure includes a protrusion aligned with the alignment key.

20 Claims, 30 Drawing Sheets

(51) Int. Cl.
*H01L 23/528* (2006.01)
*H10B 41/46* (2023.01)

(58) Field of Classification Search
CPC ........... H01L 23/5283; H01L 23/53295; H01L 23/544; H01L 25/0657; H10B 41/46; H10B 43/20; H10B 43/27; H10B 43/35; H10B 43/40; H10B 43/50
See application file for complete search history.

(56) References Cited

U.S. PATENT DOCUMENTS

| | | |
|---|---|---|
| 10,607,843 B2 | 3/2020 | Watanabe et al. |
| 2014/0151774 A1 | 6/2014 | Rhie |
| 2017/0345843 A1 | 11/2017 | Lee et al. |
| 2017/0365616 A1 | 12/2017 | Kang et al. |
| 2020/0350258 A1 | 11/2020 | Lee et al. |
| 2021/0375905 A1* | 12/2021 | Hwang ................. H10B 41/27 |

FOREIGN PATENT DOCUMENTS

| | | |
|---|---|---|
| KR | 20100078947 A | 7/2010 |
| KR | 20170142774 A | 12/2017 |

* cited by examiner

SEMICONDUCTOR DEVICE INCLUDING ALIGNMENT KEY, ELECTRONIC SYSTEM, AND METHOD OF FORMING THE SAME

CROSS-REFERENCE TO THE RELATED APPLICATION

A claim of priority under 35 U.S.C. § 119 is made to Korean Patent Application No. 10-2021-0036514, filed on Mar. 22, 2021, in the Korean Intellectual Property Office, the entirety of which is hereby incorporated by reference.

BACKGROUND

The present disclosure relates to a semiconductor device including an alignment key, an electronic system including the same, and a method of forming the same.

In electronic systems requiring storage of data, semiconductor devices capable of storing large volumes of data are needed. Accordingly, research on schemes capable of increasing data storage capacity of semiconductor devices is being conducted. For example, one of methods for increasing data storage capacity of semiconductor devices includes providing semiconductor devices having three-dimensionally arranged memory cells instead of two-dimensionally arranged memory cells. However, processes for forming three-dimensionally arranged memory cells have become increasingly difficult.

SUMMARY

Embodiments of the inventive concepts provide semiconductor devices including a multilayer structure, an electronic system including the same, and a method of forming the same.

Embodiments of the inventive concepts provide a semiconductor device including a first stack structure including a plurality of first insulating layers and a plurality of first wiring layers repeatedly and alternately stacked on a substrate. A second stack structure includes a plurality of second insulating layers and a plurality of second wiring layers repeatedly and alternately stacked on the first stack structure. A first channel hole extends through the first stack structure. A second channel hole extends through the second stack structure and communicates with the first channel hole. A channel structure is disposed in the first channel hole and the second channel hole. A first auxiliary stack structure includes the plurality of first insulating layers and a plurality of first mold layers repeatedly and alternately stacked on the substrate. An alignment key extends into the first auxiliary stack structure and protrudes to a higher level than an uppermost end of the first stack structure. A second auxiliary stack structure is disposed on the first auxiliary stack structure and the alignment key and includes the plurality of second insulating layers and a plurality of second mold layers repeatedly and alternately stacked. The second auxiliary stack structure includes a protrusion aligned with the alignment key. An uppermost end of the protrusion protrudes to a higher level than an uppermost end of the second stack structure.

Embodiments of the inventive concepts further provide a semiconductor device including a substrate including a first area, and a second area spaced apart from the first area. A first stack structure including a plurality of first insulating layers and a plurality of first wiring layers are repeatedly and alternately stacked in the first area on a substrate. A second stack structure including a plurality of second insulating layers and a plurality of second wiring layers are repeatedly and alternately stacked on the first stack structure. A first channel hole extends through the first stack structure. A second channel hole extends through the second stack structure and communicates with the first channel hole. A channel structure is disposed in the first channel hole and the second channel hole. A bit line is disposed on the channel structure. A first auxiliary stack structure includes the plurality of first insulating layers and a plurality of first mold layers repeatedly and alternately stacked in the second area on the substrate. An alignment key extends into the first auxiliary stack structure and protrudes to a higher level than an uppermost end of the first stack structure. A second auxiliary stack structure is disposed on the first auxiliary stack structure and the alignment key and includes the plurality of second insulating layers and a plurality of second mold layers repeatedly and alternately stacked. The second auxiliary stack structure includes a protrusion aligned with the alignment key. An uppermost end of the protrusion protrudes to a higher level than an uppermost end of the second stack structure.

Embodiments of the inventive concepts still further provide an electronic system including a semiconductor device on a main substrate, and a controller electrically connected to the semiconductor device on the main substrate. The semiconductor device includes a substrate including a first area, and a second area spaced apart from the first area. A first stack structure includes a plurality of first insulating layers and a plurality of first wiring layers repeatedly and alternately stacked in the first area on a substrate. A second stack structure includes a plurality of second insulating layers and a plurality of second wiring layers repeatedly and alternately stacked on the first stack structure. A first channel hole extends through the first stack structure. A second channel hole extends through the second stack structure and communicates with the first channel hole. A channel structure is disposed in the first channel hole and the second channel hole. A bit line is disposed on the channel structure. A first auxiliary stack structure includes the plurality of first insulating layers and a plurality of first mold layers repeatedly and alternately stacked in the second area on the substrate. An alignment key extends into the first auxiliary stack structure and protrudes to a higher level than an uppermost end of the first stack structure. A second auxiliary stack structure disposed on the first auxiliary stack structure and the alignment key and includes the plurality of second insulating layers and a plurality of second mold layers repeatedly and alternately stacked. The second auxiliary stack structure includes a protrusion aligned with the alignment key. An uppermost end of the protrusion protrudes to a higher level than an uppermost end of the second stack structure.

BRIEF DESCRIPTION OF THE DRAWINGS

Embodiments of the inventive concepts will be described in detail with reference to the accompanying drawings.

DETAILED DESCRIPTION

Figure 1:
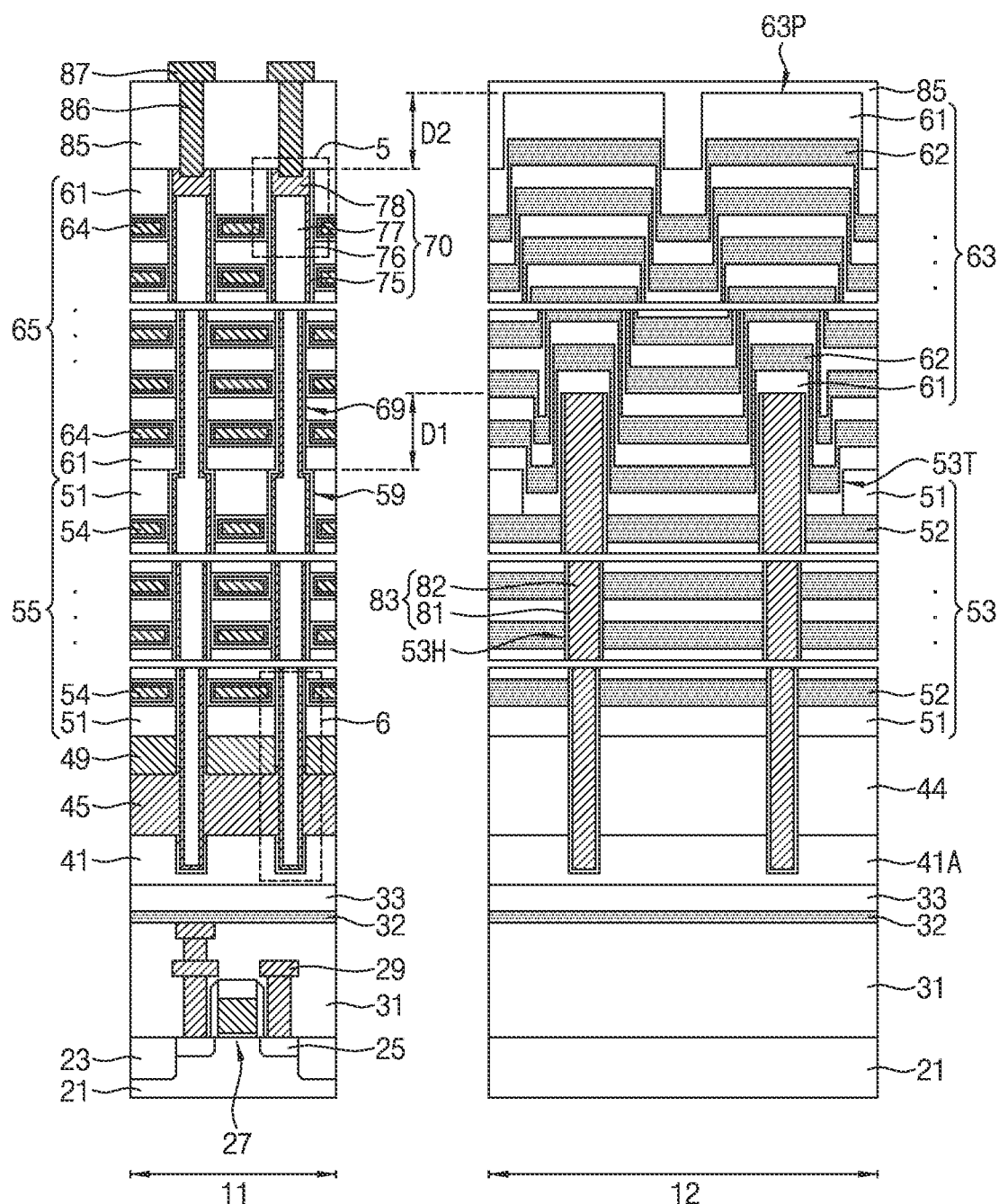
FIG. 1 illustrates a sectional view explanatory of semiconductor devices according to embodiments of the inventive concepts.
Figure 2:
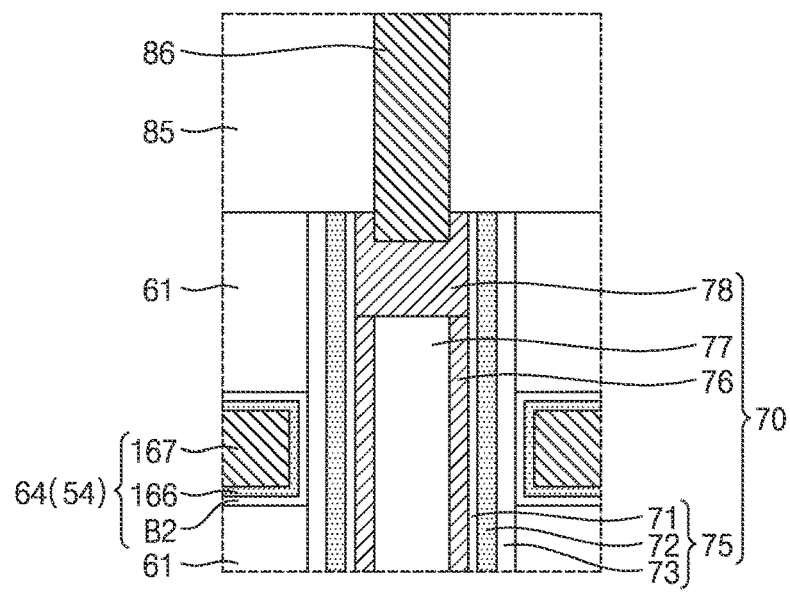
FIG. 2 illustrates an enlarged view of portion 5 of FIG. 1.
Figure 3:
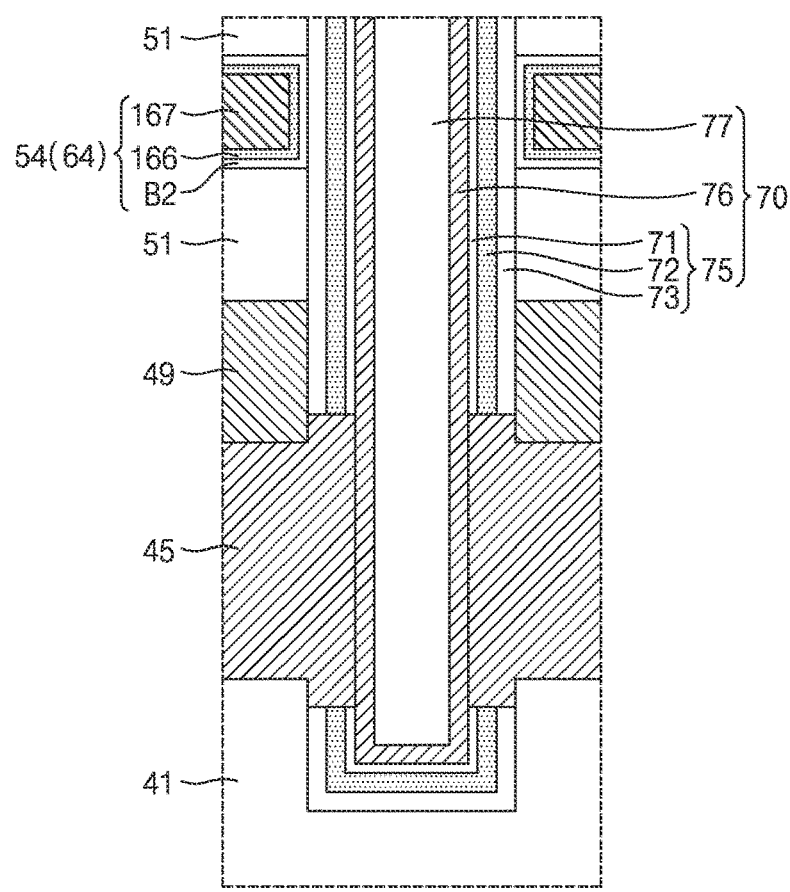
FIG. 3 illustrates an enlarged view of portion 6 of FIG. 1.

FIG. 1 illustrates a sectional view explanatory of semiconductor devices according to embodiments of the inventive concepts. FIG. 2 illustrates an enlarged view of portion 5 of FIG. 1. FIG. 3 illustrates an enlarged view of portion 6 of FIG. 1. Semiconductor devices according to embodiments of the inventive concepts may include non-volatile memory such as VNAND or 3D flash memory, and may include cell-on-peripheral (COP) structure, but are not limited thereto.

Referring to FIG. 1, semiconductor devices of embodiments of the inventive concepts may include a substrate 21 including a first area 11 and a second area 12, an element isolation layer 23, a plurality of impurity regions 25, a transistor 27, a plurality of peripheral circuit wiring layers 29, a first interlayer insulating layer 31, a second interlayer insulating layer 32, a third interlayer insulating layer 33, a horizontal wiring layer 41, a horizontal buried layer 41A, a fourth interlayer insulating layer 44, a sealing conductive layer 45, a support 49, a first auxiliary stack structure 53, a key trench 53T, a plurality of key holes 53H, a first stack structure 55, a plurality of first channel holes 59, a second auxiliary stack structure 63, a second stack structure 65, a plurality of second channel holes 69, a plurality of channel structures 70, a plurality of alignment keys 83, a fifth interlayer insulating layer 85, a plurality of bit plugs 86, and a plurality of bit lines 87.

The first auxiliary stack structure 53 may include a plurality of first insulating layers 51 and a plurality of first mold layers 52 which are repeatedly and alternately stacked. The first stack structure 55 may include the plurality of first insulating layers 51 and a plurality of first wiring layers 54 which are repeatedly and alternately stacked. The second auxiliary stack structure 63 may include a plurality of second insulating layers 61 and a plurality of second mold layers 62 which are repeatedly and alternately stacked. The second stack structure 65 may include the plurality of second insulating layers 61 and a plurality of second wiring layers 64 which are repeatedly and alternately stacked. The second auxiliary stack structure 63 in the second area 12 may include a plurality of protrusions 63P.

Each of the plurality of channel structures 70 may include a core pattern 77, a channel layer 76 surrounding an outside of the core pattern 77, an information storage pattern 75 surrounding an outside of the channel layer 76, and a bit pad 78 on the channel layer 76. Each of the plurality of alignment keys 83 may include a liner 81 and a buried layer 82.

The horizontal wiring layer 41 may correspond to a common source line. The plurality of first wiring layers 54 and the plurality of second wiring layers 64 may include a plurality of word lines. A plurality of non-volatile memory cells may be configured at intersections of the plurality of first wiring layers 54 and the plurality of channel structures 70, and intersections of the plurality of second wiring layers 64 and the plurality of channel structures 70.

Referring to FIG. 2, each of the plurality of channel structures 70 may include the core pattern 77, the channel layer 76, the information storage pattern 75, and the bit pad 78. The information storage pattern 75 may include a tunnel insulating layer 71 surrounding the outside of the channel layer 76, a charge storage layer 72 surrounding an outside of the tunnel insulating layer 71, and a first blocking layer 73 surrounding an outside of the charge storage layer 72. The bit plug 86 may extend through the fifth interlayer insulating layer 85 and, as such, may directly contact the bit pad 78.

The tunnel insulating layer 71 may include an insulating layer such as silicon oxide for example. The charge storage layer 72 may include an insulating layer such as silicon nitride for example. The first blocking layer 73 may include for example an insulating layer such as silicon oxide, silicon nitride, silicon oxynitride, high-k dielectrics (for example, metal oxide such as HfO, AlO, or a combination thereof, or metal silicate such as HfSiO), or a combination thereof. The channel layer 76 may include for example a semiconductor layer such as polysilicon, amorphous silicon, monocrystalline silicon, or a combination thereof. The core pattern 77 may include silicon oxide, silicon nitride, silicon oxynitride, low-k dielectrics, high-k dielectrics, polysilicon, or a combination thereof. The bit pad 78 may include for example a conductive material such as polysilicon, amorphous silicon, monocrystalline silicon, metal, metal nitride, metal oxide, metal silicide, conductive carbon, or a combination thereof.

Each of the plurality of second wiring layers 64 may include a second blocking layer B2, a barrier layer 166, and an electrode layer 167. The barrier layer 166 may be formed at an outside of the electrode layer 167. The second blocking layer B2 may be formed at an outside of the barrier layer 166. Each of the plurality of second wiring layers 64 may include substantially the same configuration as each of the plurality of first wiring layers 54. In an embodiment, each of the plurality of second wiring layers 64 may include a material layer identical to that of each of the plurality of first wiring layers 54 while being formed simultaneously therewith.

The second blocking layer B2 may include for example silicon oxide, silicon nitride, silicon oxynitride, silicon boron nitride (SiBN), silicon carbon nitride (SiCN), low-k dielectrics, high-k dielectrics (for example, metal oxide such as HfO or AlO, metal silicate such as HfSiO, etc.), or a combination thereof. In an embodiment, the second blocking layer B2 may include an aluminum oxide layer. In other embodiments the second blocking layer B2 may be omitted.

The barrier layer 166 and the electrode layer 167 may include a conductive material such as for example metal, metal nitride, metal oxide, metal silicide, conductive carbon, polysilicon, amorphous silicon, monocrystalline silicon, or a combination thereof. In an embodiment, the barrier layer 166 may include Ti, TiN, Ta, TaN, or a combination thereof. The electrode layer 167 may include W, WN, Ti, TiN, Ta, TaN, Co, Ni, Ru, Pt, polysilicon, conductive carbon, or a combination thereof.

Referring to FIG. 3, the sealing conductive layer 45 may be disposed between the horizontal wiring layer 41 and the support 49. The sealing conductive layer 45 may extend through a side surface of the information storage pattern 75 and, as such, may contact the channel layer 76. The channel layer 76 may be electrically connected to the horizontal wiring layer 41 via the sealing conductive layer 45.

Each of the plurality of first wiring layers 54 may include a second blocking layer B2, a barrier layer 166, and an electrode layer 167. Each of the plurality of first wiring layers 54 may have substantially the same configuration as each of the plurality of second wiring layers 64. In an embodiment, each of the plurality of first wiring layers 54 may include a material layer identical to that of each of the plurality of second wiring layers 64 while being formed simultaneously therewith.

Again referring to FIGS. 1 to 3, the second area 12 may be spaced apart from the first area 11. In an embodiment, the first area 11 may include a memory cell area. The second area 12 may include a first key area. The second area 12 may be disposed in a scribe lane of the substrate 21. The substrate 21 may include a semiconductor substrate such as a silicon wafer or a silicon-on-insulator (SOI) wafer. The element isolation layer 23 may be formed on the substrate 21. The plurality of impurity regions 25 may be formed in the substrate 21. Each of the plurality of impurity regions 25 may include N-type or P-type impurities.

The transistor 27 may be formed in the substrate 21 and/or on the substrate 21 in accordance with various methods. The transistor 27 may include a fin field effect transistor (Fin-FET), a multi-bridge channel transistor such as MBCFET®, a nanowire transistor, a vertical transistor, a recess channel transistor, a 3-D transistor, a planar transistor, or a combination thereof. The transistor 27 may include some of the plurality of impurity regions 25. Some of the plurality of impurity regions 25 may correspond to a drain region or a source region.

The first interlayer insulating layer 31 may be formed on the substrate 21 to cover the transistor 27 and the element isolation layer 23. The plurality of peripheral circuit wiring layers 29 may be formed in the first interlayer insulating layer 31. The plurality of peripheral circuit wiring layers 29 may include horizontal and vertical wirings having various shapes. Some of the plurality of peripheral circuit wiring layers 29 may directly contact the plurality of impurity regions 25. The transistor 27 and the plurality of peripheral circuit wiring layers 29 may constitute a peripheral circuit. The second interlayer insulating layer 32 may be formed on the first interlayer insulating layer 31 and the plurality of peripheral circuit wiring layers 29. The third interlayer insulating layer 33 may be formed on the second interlayer insulating layer 32.

Each of the element isolation layer 23, the first interlayer insulating layer 31, the second interlayer insulating layer 32 and the third interlayer insulating layer 33 may include a single layer or multiple layers. Each of the element isolation layer 23, the first interlayer insulating layer 31, the second interlayer insulating layer 32 and the third interlayer insulating layer 33 may include for example silicon oxide, silicon nitride, silicon oxynitride, silicon boron nitride (SiBN), silicon carbon nitride (SiCN), low-k dielectrics, high-k dielectrics, or a combination thereof. The second interlayer insulating layer 32 may correspond to a capping layer or an etch stop layer. The second interlayer insulating layer 32 may include a material different from those of the first interlayer insulating layer 31 and the third interlayer insulating layer 33. For example, the second interlayer insulating layer 32 may include silicon nitride, silicon oxynitride, silicon boron nitride (SiBN), silicon carbon nitride (SiCN), or a combination thereof. The first interlayer insulating layer 31 and the third interlayer insulating layer 33 may include silicon oxide. The plurality of peripheral circuit wiring layers 29 may include a single layer or multiple layers. The plurality of peripheral circuit wiring layers 29 may include a conductive material such as for example metal, metal nitride, metal oxide, metal silicide, conductive carbon, polysilicon, amorphous silicon, monocrystalline silicon, or a combination thereof.

The horizontal wiring layer 41, the sealing conductive layer 45 and the support 49 may be sequentially stacked on the third interlayer insulating layer 33 in the first area 11. The horizontal buried layer 41A and the fourth interlayer insulating layer 44 may be sequentially stacked on the third interlayer insulating layer 33 in the second area 12.

Lower surfaces of the horizontal wiring layer 41 and the horizontal buried layer 41A may be substantially coplanar. The horizontal wiring layer 41 may include a material different from that of the horizontal buried layer 41A. The horizontal wiring layer 41 may include a single layer or multiple layers. The horizontal wiring layer 41 may include a conductive material such as for example metal, metal nitride, metal oxide, metal silicide, conductive carbon, polysilicon, amorphous silicon, monocrystalline silicon, or a combination thereof. In an embodiment, the horizontal wiring layer 41 may include a conductive layer such as a polysilicon layer including N-type impurities or a monocrystalline semiconductor layer including N-type impurities. The horizontal buried layer 41A may include an insulating material, metal, metal nitride, metal oxide, metal silicide, conductive carbon, polysilicon, amorphous silicon, monocrystalline silicon, or a combination thereof. In an embodiment, the horizontal buried layer 41A may include a silicon oxide layer or an undoped polysilicon layer. In an embodiment, upper surfaces of the horizontal wiring layer 41 and the horizontal buried layer 41A may be substantially coplanar.

Upper surfaces of the support 49 and the fourth interlayer insulating layer 44 may be substantially coplanar. The first stack structure 55 may be stacked on the support 49. The first auxiliary stack structure 53 may be stacked on the fourth interlayer insulating layer 44. The first stack structure 55 and the first auxiliary stack structure 53 may have substantially the same thickness. Lower surfaces of the first stack structure 55 and the first auxiliary stack structure 53 may be substantially coplanar. An interface between the first stack structure 55 and the support 49 may be substantially coplanar with an interface between the first auxiliary stack structure 53 and the fourth interlayer insulating layer 44. Upper surfaces of the first stack structure 55 and the first auxiliary stack structure 53 may be substantially coplanar.

Each of the plurality of first channel holes 59 may extend into the horizontal wiring layer 41 while extending through the first stack structure 55, the support 49 and the sealing conductive layer 45. Each of the plurality of first channel holes 59 may have a smaller horizontal width at a lower portion thereof than at an upper portion thereof. The key trench 53T may be disposed at an upper portion of the first auxiliary stack structure 53. The key trench 53T may extend into the first auxiliary stack structure 53. The key trench 53T may have various horizontal widths and various depths. The plurality of key holes 53H may be disposed under the key trench 53T. Each of the plurality of key holes 53H may extend into the horizontal buried layer 41A while extending through the first auxiliary stack structure 53 and the fourth interlayer insulating layer 44. Each of the plurality of key holes 53H may have a smaller horizontal width at a lower portion thereof than an upper portion thereof. The plurality of key holes 53H may communicate with a bottom of the key trench 53T.

In an embodiment, bottoms of the plurality of first channel holes 59 and the plurality of key holes 53H may be disposed at substantially the same level. The minimum distance between a lowermost end of each of the plurality of key holes 53H and a lower surface of the substrate 21 may be substantially equal to the minimum distance between a lower surface of each of the plurality of first channel holes 59 and the lower surface of the substrate 21.

The plurality of alignment keys 83 may fill the plurality of key holes 53H, and may protrude to a higher level than an upper surface of the first auxiliary stack structure 53. The plurality of alignment keys 83 may protrude to a higher level than an uppermost end of the first stack structure 55. The plurality of alignment keys 83 may include a polysilicon layer, a W layer, a silicon nitride layer, or a combination thereof. In an embodiment, each of the plurality of alignment keys 83 may include the buried layer 82, and the liner 81 surrounding a side surface and a bottom of the buried layer 82. The liner 81 may include a material different from that of the buried layer 82. For example, the buried layer 82 may include polysilicon, and the liner 81 may include silicon nitride.

The minimum distance between an uppermost end of each of the plurality of alignment keys 83 and the lower surface of the substrate 21 may be greater than the minimum distance between the uppermost end of the first stack structure 55 and the lower surface of the substrate 21. The minimum distance between the uppermost end of each of the plurality of alignment keys 83 and the lower surface of the substrate 21 may be greater than the minimum distance between an uppermost end of each of the plurality of first channel holes 59 and the lower surface of the substrate 21.

The minimum distance between a horizontal line passing through uppermost ends of the first stack structure 55 and an uppermost end of the first auxiliary stack structure 53, and a horizontal line passing through the uppermost end of each of the plurality of alignment keys 83 may be represented by a first length D1. The first length D1 may be 1 to 100 nm. In an embodiment, the first length D1 may be about 50 nm. The first length D1 may correspond to a difference between the minimum distance between the uppermost end of each of the plurality of alignment keys 83 and the lower surface of the substrate 21, and the minimum distance between the uppermost end of the first stack structure 55 and the lower surface of the substrate 21.

The second stack structure 65 may be stacked on the first stack structure 55. Each of the plurality of second channel holes 69 may extend through the second stack structure 65 and, as such, may communicate with a corresponding one of the plurality of first channel holes 59. Each of the plurality of second channel holes 69 may have a smaller horizontal width at a lower portion thereof than at an upper portion thereof. In a region adjacent to a boundary between each of the plurality of first channel holes 59 and each of the plurality of second channel holes 69, the horizontal width of each of the plurality of second channel holes 69 may be smaller than the horizontal width of each of the plurality of first channel holes 59. The plurality of channel structures 70 may be disposed in the plurality of second channel holes 69 and the plurality of first channel holes 59. The minimum distance between a lowermost end of each of the plurality of alignment keys 83 and the lower surface of the substrate 21 may be substantially equal to the minimum distance between a lowermost end of each of the plurality of channel structures 70 and the lower surface of the substrate 21.

The second auxiliary stack structure 63 may be stacked on the first auxiliary stack structure 53 and the plurality of alignment keys 83. The second auxiliary stack structure 63 may have substantially the same thickness as the second stack structure 65. The second auxiliary stack structure 63 may fill the interior of the key trench 53T. The second auxiliary stack structure 63 may contact side surfaces and upper surfaces of the plurality of alignment keys 83. The second auxiliary stack structure 63 may include the plurality of protrusions 63P aligned on the plurality of alignment keys 83. Uppermost ends of the plurality of protrusions 63P may protrude to a higher level than an uppermost end of the second stack structure 65.

The minimum distance between the uppermost end of each of the plurality of protrusions 63P and the lower surface of the substrate 21 may be greater than the minimum distance between the uppermost end of the second stack structure 65 and the lower surface of the substrate 21. The minimum distance between the uppermost end of each of the plurality of protrusions 63P and the lower surface of the substrate 21 may be greater than the minimum distance between an uppermost end of each of the plurality of channel structures 70 and the lower surface of the substrate 21. The minimum distance between the uppermost end of each of the plurality of protrusions 63P and the lower surface of the substrate 21 may be greater than the minimum distance between an uppermost end of each of the plurality of second channel holes 69 and the lower surface of the substrate 21.

The fifth interlayer insulating layer 85 may cover the second stack structure 65, the plurality of channel structures 70, and the second auxiliary stack structure 63. The plurality of bit plugs 86 may extend through the fifth interlayer insulating layer 85 and, as such, may be electrically connected to the plurality of channel structures 70. The plurality of bit lines 87 may be disposed on the fifth interlayer insulating layer 85. Each of the plurality of bit lines 87 may contact a corresponding one of the plurality of bit plugs 86.

FIGS. 4 to 8 illustrate sectional views explanatory of semiconductor devices according to embodiments of the inventive concepts.

Figure 4:
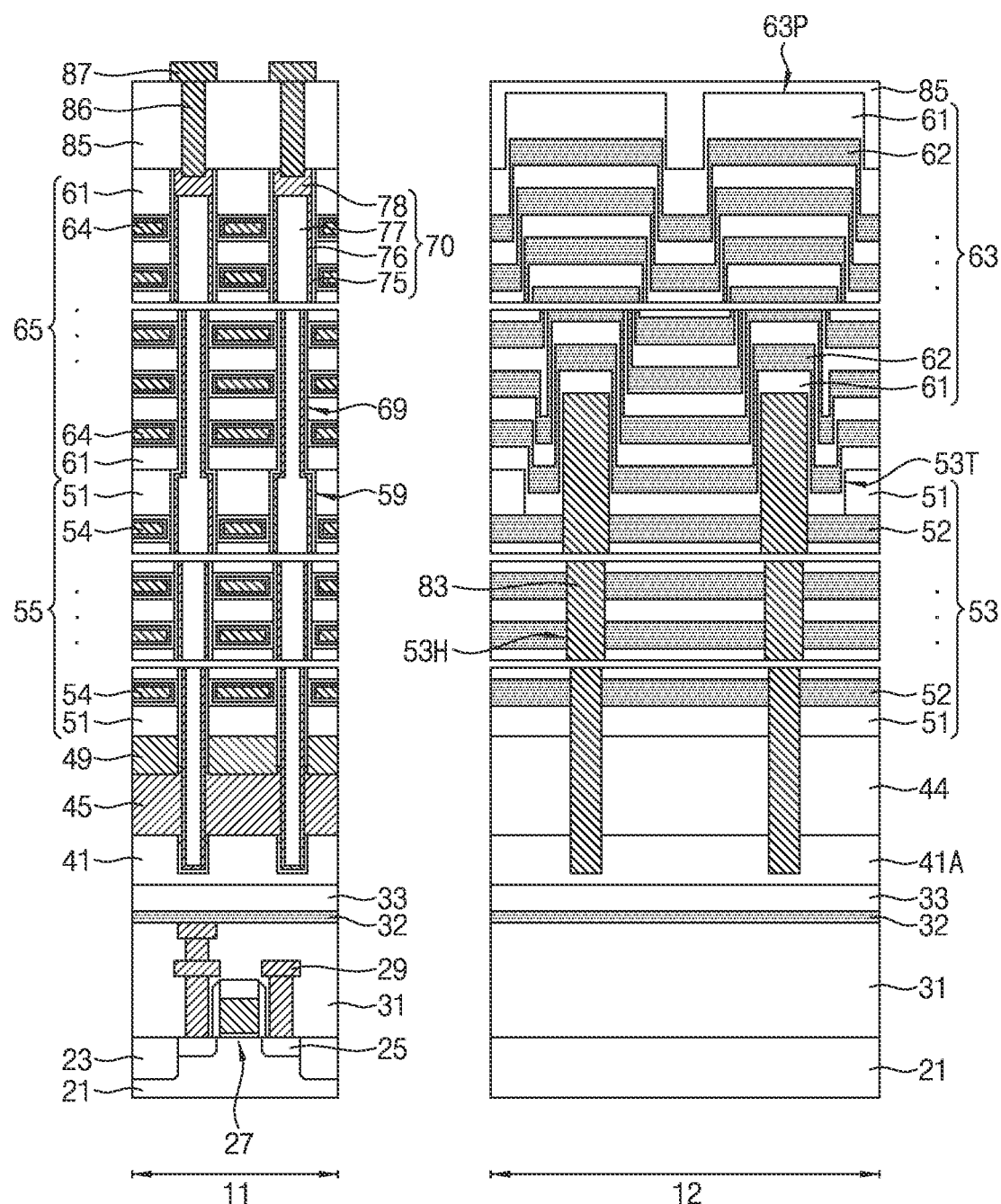
FIG. 4 illustrates a sectional view explanatory of a semiconductor device according to embodiments of the inventive concepts.

Referring to FIG. 4, each of a plurality of alignment keys 83 may be a single layer. For example, each of the plurality of alignment keys 83 may be a polysilicon layer, a W layer, or a silicon nitride layer.

Figure 5:
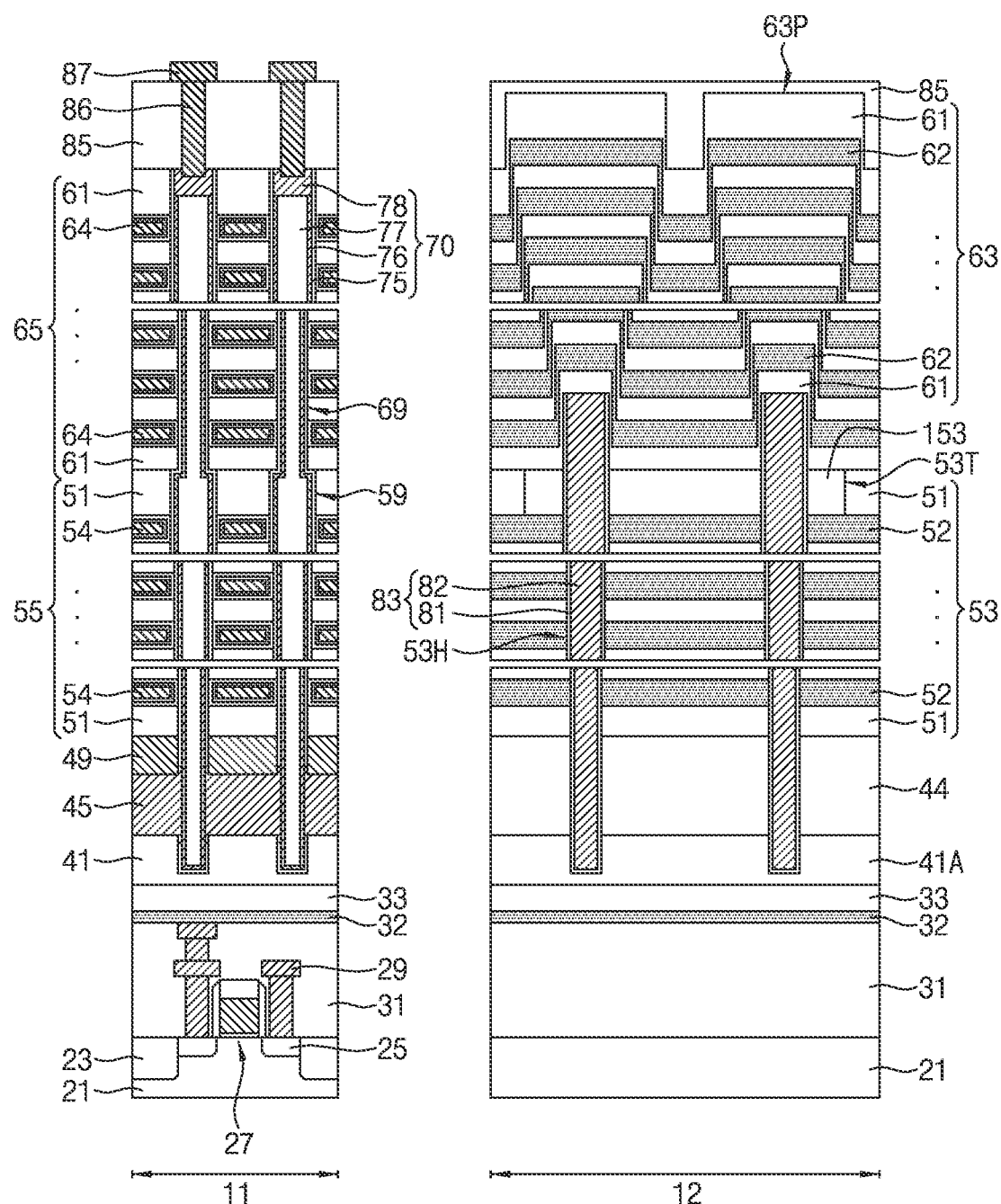
FIG. 5 illustrates a sectional view explanatory of a semiconductor device according to embodiments of the inventive concepts.

Referring to FIG. 5, an anti-polishing pattern 153 may be preserved in a key trench 53T. An upper surface of a first auxiliary stack structure 53 and an upper surface of the anti-polishing pattern 153 may be substantially coplanar. Each of a plurality of alignment keys 83 may extend into the first auxiliary stack structure 53 while extending through the anti-polishing pattern 153.

Figure 6:
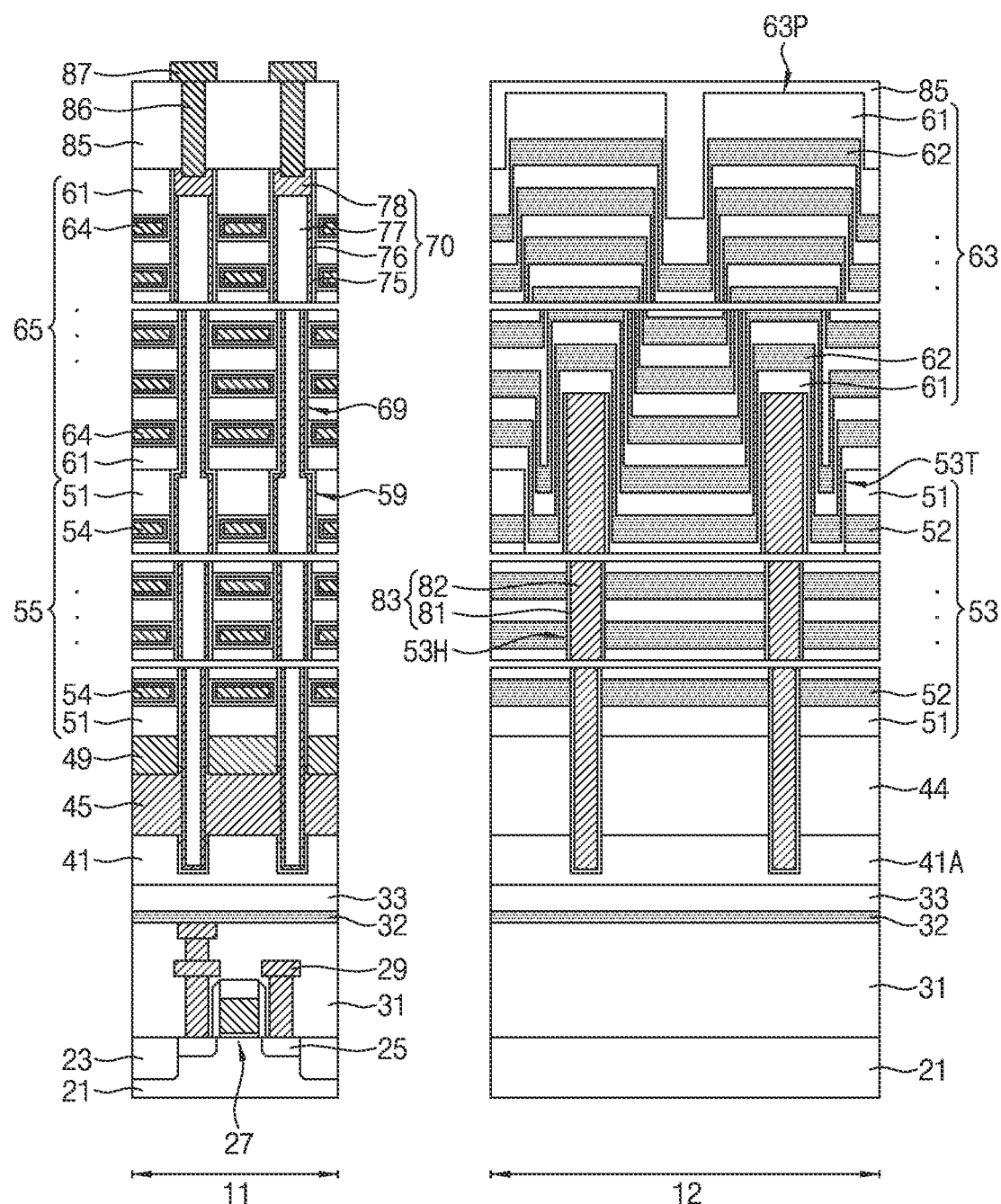
FIG. 6 illustrates a sectional view explanatory of a semiconductor device according to embodiments of the inventive concepts.

Referring to FIG. 6, a key trench 53T may have a size different than the key trench 53T shown in FIG. 1. In the embodiment shown in FIG. 6, the key trench 53T may extend into a first auxiliary stack structure 53 while extending through at least one of a plurality of first insulating layers 51 and at least one of a plurality of first mold layers 52, in contrast to FIG. 1 in which the key trench 53T extends only through the first insulating layer 51. In other embodiments, the key trench 53T may have various depths and sizes, and may extend through plural layers of the first auxiliary stack structure 53.

Figure 7:
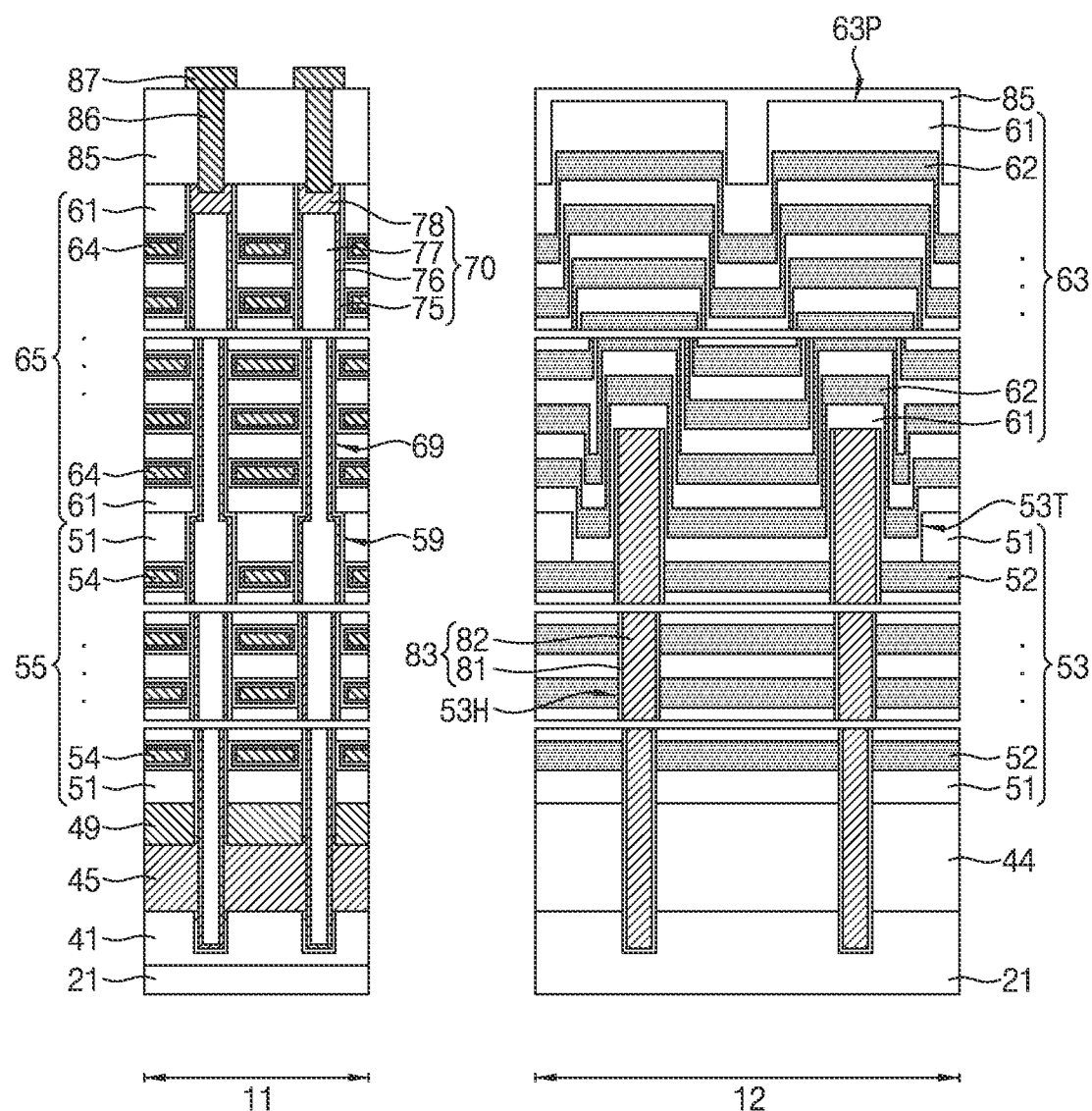
FIG. 7 illustrates a sectional view explanatory of a semiconductor device according to embodiments of the inventive concepts.

Referring to FIG. 7, a horizontal wiring layer 41 may be disposed on a substrate 21 in a first area 11. The horizontal wiring layer 41 may be formed by implanting impurity ions from an upper surface of the substrate 21 up to a predetermined depth. For example, the horizontal wiring layer 41 may include a monocrystalline silicon layer including N-type impurities. A plurality of first channel holes 59 may extend into the horizontal wiring layer 41. A plurality of channel structures 70 may extend into the horizontal wiring layer 41.

The upper surface of the substrate 21 in a second area 12 may be substantially coplanar with an upper surface of the horizontal wiring layer 41. A fourth interlayer insulating layer 44 may be disposed on the substrate 21 in the second area 12. A plurality of key holes 53H may extend into the substrate 21. A plurality of alignment keys 83 may extend into the substrate 21.

Figure 8:
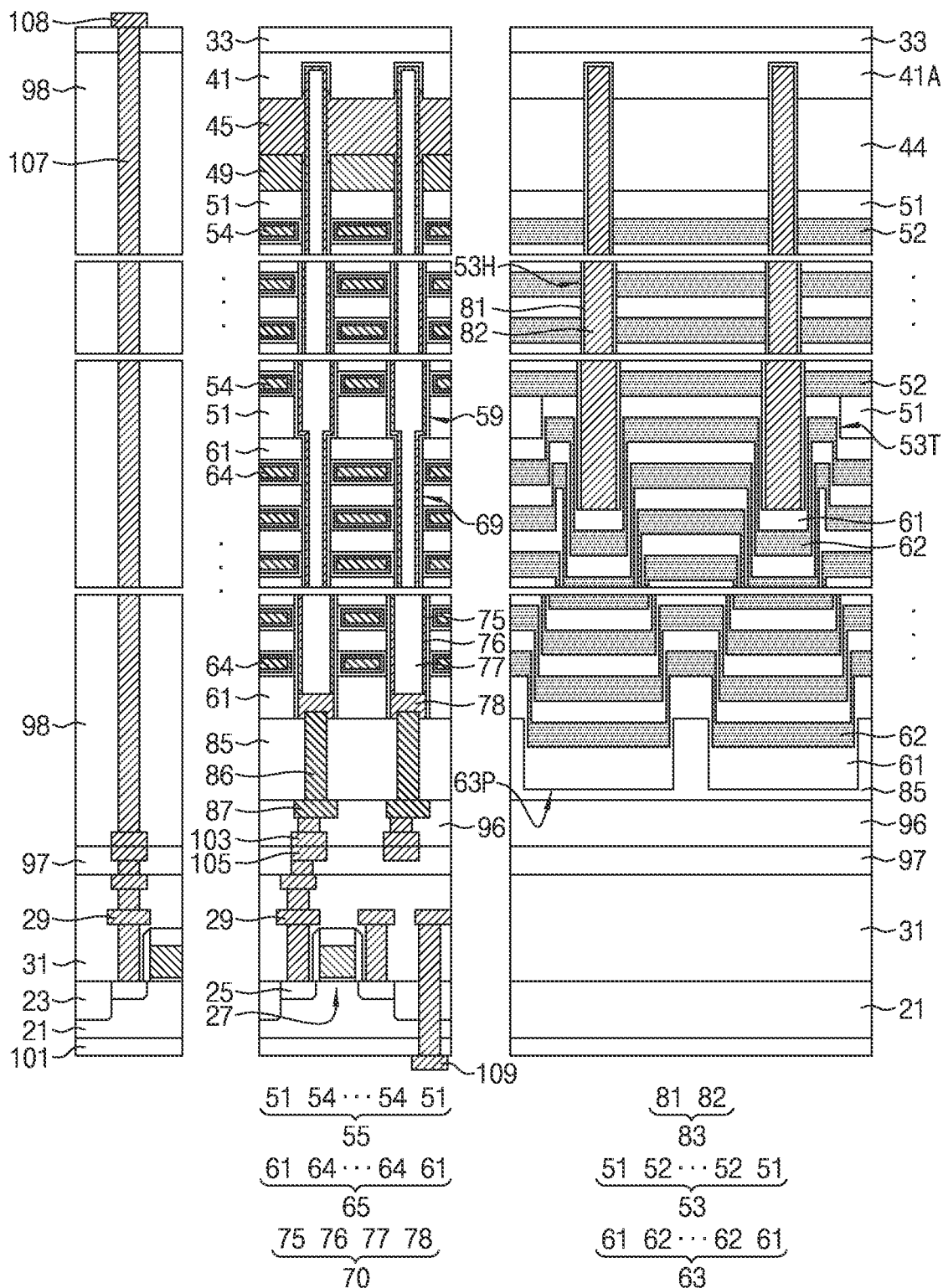
FIG. 8 illustrates a sectional view explanatory of a semiconductor device according to embodiments of the inventive concepts.

Referring to FIG. 8, a semiconductor device according to embodiments of the inventive concepts may include a substrate 21, an element isolation layer 23, a plurality of impurity regions 25, a plurality of transistors 27, a plurality of peripheral circuit wiring layers 29, a first interlayer insulating layer 31, a third interlayer insulating layer 33, a horizontal wiring layer 41, a horizontal buried layer 41A, a fourth interlayer insulating layer 44, a sealing conductive layer 45, a support 49, a first auxiliary stack structure (corresponding to 53 in FIG. 1 and including layers 51 and 52), a key trench 53T, a plurality of key holes 53H, a first stack structure (corresponding to 55 in FIG. 1 and including layers 51 and 54), a plurality of first channel holes 59, a second auxiliary stack structure (corresponding to 63 in FIG. 1 and including layers 61 and 62), a second stack structure (corresponding to 65 in FIG. 1 and including layers 61 and 64), a plurality of second channel holes 69, a plurality of channel structures (corresponding to 70 in FIG. 1 and including 75, 76, 77 and 78), a plurality of alignment keys (corresponding to 83 in FIG. 1 and including liner 81 and buried layer 82), a fifth interlayer insulating layer 85, a plurality of bit plugs 86, a plurality of bit lines 87, a sixth interlayer insulating layer 96, a seventh interlayer insulating layer 97, an eighth interlayer insulating layer 98, a backside insulating layer 101, a plurality of first bonding structures 103, a plurality of second bonding structures 105, a through electrode 107, a first outer pad 108, and a second outer pad 109.

Each of the sixth interlayer insulating layer 96, the seventh interlayer insulating layer 97, the eighth interlayer insulating layer 98, and the backside insulating layer 101 may be dielectrics including for example at least two selected from a group consisting of Si, O, N, B and C. Each of the sixth interlayer insulating layer 96, the seventh interlayer insulating layer 97, the eighth interlayer insulating layer 98, and the backside insulating layer 101 may include silicon oxide, silicon nitride, silicon oxynitride, low-k dielectrics, high-k dielectrics, or a combination thereof. Each of the sixth interlayer insulating layer 96, the seventh interlayer insulating layer 97, the eighth interlayer insulating layer 98, and the backside insulating layer 101 may be a single layer or multiple layers. Each of the plurality of first bonding structures 103, the plurality of second bonding structures 105, the through electrode 107, the first outer pad 108, and the second outer pad 109 may include a conductive material such as for example metal, metal nitride, metal oxide, metal silicide, conductive carbon, or a combination thereof.

The backside insulating layer 101 may cover a lower surface of the substrate 21. The second outer pad 109 may be formed on the backside insulating layer 101. The second outer pad 109 may extend through the backside insulating layer 101 and the substrate 21 and, as such, may be connected to the plurality of peripheral circuit wiring layers 29. The seventh interlayer insulating layer 97 may be formed on the first interlayer insulating layer 31. The plurality of second bonding structures 105 may be disposed in the seventh interlayer insulating layer 97. Each of the plurality of second bonding structures 105 may be connected to a corresponding one of the plurality of peripheral circuit wiring layers 29. Upper surfaces of the plurality of second bonding structures 105 and the seventh interlayer insulating layer 97 may be substantially coplanar.

The sixth interlayer insulating layer 96 may cover one surface of each of the plurality of bit lines 87. The plurality of first bonding structures 103 may be formed in the sixth interlayer insulating layer 96. Each of the plurality of bit lines 87 may be connected to a corresponding one of the plurality of first bonding structures 103. Lower surfaces of the plurality of first bonding structures 103 and the sixth interlayer insulating layer 96 may be substantially coplanar.

The plurality of first bonding structures 103 and the sixth interlayer insulating layer 96 may be bonded to the plurality of second bonding structures 105 and the seventh interlayer insulating layer 97. The plurality of first bonding structures 103 may be bonded to the plurality of second bonding structures 105 through wafer bonding. Each of the plurality of first bonding structures 103 and the plurality of second bonding structures 105 may include, for example, copper (Cu). Each of the sixth interlayer insulating layer 96 and the seventh interlayer insulating layer 97 may include, for example, silicon oxide.

The first outer pad 108 may be disposed on the third interlayer insulating layer 33. The first outer pad 108 may be connected to the through electrode 107 which extends through the eighth interlayer insulating layer 98. The first outer pad 108 may be connected to the plurality of peripheral circuit wiring layers 29 via the through electrode 107. A selected one of the first outer pad 108 and the second outer pad 109 may be omitted.

FIGS. 9 to 25 illustrate sectional views explanatory of semiconductor device formation methods according to embodiments of the inventive concepts.

Figure 9:
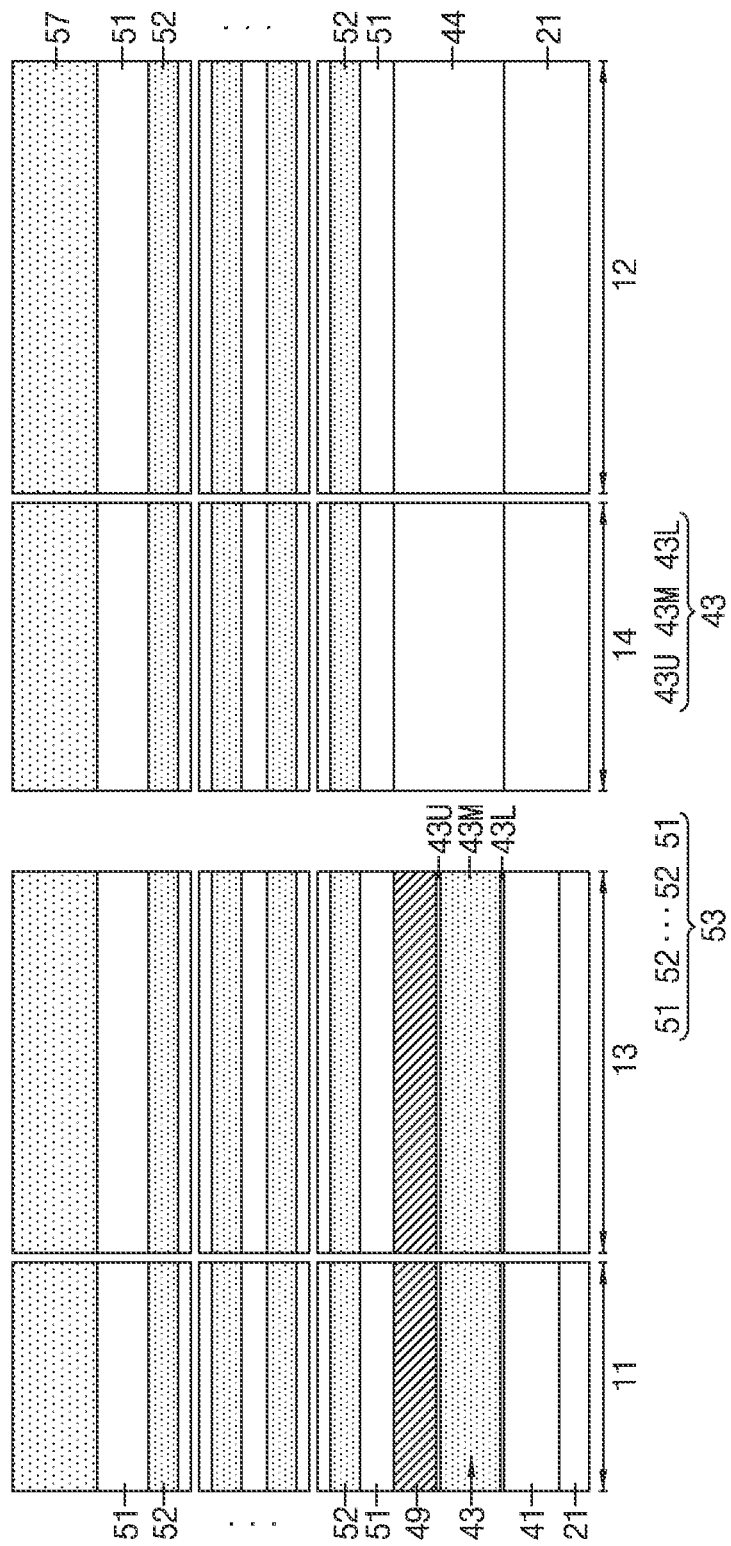
FIGS. 9, 10, 11, 12, 13, 14, 15, 16, 17, 18, 19, 20, 21, 22, 23, 24, 25, 26, 27 and 28 illustrate sectional views explanatory of semiconductor device formation methods according to embodiments of the inventive concepts.

Referring to FIG. 9, a horizontal wiring layer 41, a connecting mold layer 43, a fourth interlayer insulating layer 44, a support 49, a first auxiliary stack structure 53, and a stopper 57 may be formed on a substrate 21. The substrate 21 may include a first area 11, a second area 12, a third area 13, and a fourth area 14. The connecting mold layer 43 may include a lower layer 43L, an upper layer 43U, and a middle layer 43M between the lower layer 43L and the upper layer 43U. The first auxiliary stack structure 53 may include a plurality of first insulating layers 51 and a plurality of first mold layers 52 which are repeatedly and alternately stacked.

The substrate 21 may include a semiconductor substrate such as a silicon wafer or a silicon-on-insulator (SOI) wafer. The first area 11 may include a memory cell area. The second area 12 may include a first key area. The second area 12 may be spaced apart from the first area 11. In an embodiment, the second area 12 may be disposed in a scribe lane. The third area 13 may include an extension area. The third area 13 may be adjacent to the first area 11. In an embodiment, the third area 13 may be in continuity with a side surface of the first area 11. The third area 13 may be spaced apart from the second area 12. The fourth area 14 may include a second key area. The fourth area 14 may be spaced apart from the first area 11, the second area 12, and the third area 13. In an embodiment, the fourth area 14 may be disposed in a scribe lane.

The horizontal wiring layer 41 may be formed in the first area 11 and the third area 13 on the substrate 21. The horizontal wiring layer 41 may include a single layer or multiple layers. The horizontal wiring layer 41 may include for example a conductive material such as metal, metal nitride, metal oxide, metal silicide, conductive carbon, polysilicon, amorphous silicon, monocrystalline silicon, or a combination thereof. In an embodiment, the horizontal wiring layer 41 may include a conductive layer such as a polysilicon layer including N-type impurities or a monocrystalline semiconductor layer including N-type impurities. In an embodiment, the horizontal wiring layer 41 may be formed by implanting N-type impurities into the substrate 21. Upper surfaces of the horizontal wiring layer 41 in the first and third areas 11 and 13 may be substantially coplanar with upper surfaces of the substrate 21 in the second and fourth areas 12 and 14.

The connecting mold layer 43 and the support 49 may be sequentially stacked on the horizontal wiring layer 41. The fourth interlayer insulating layer 44 may be formed in the second area 12 and the fourth area 14 on the substrate 21. Upper surfaces of the support 49 and the fourth interlayer insulating layer 44 may be substantially coplanar. The connecting mold layer 43 may include a material having etch selectivity with respect to the horizontal wiring layer 41 and the support 49. The connecting mold layer 43 may include a single layer or multiple layers. The connecting mold layer 43 may include for example silicon oxide, silicon nitride, silicon oxynitride, low-k dielectrics, high-k dielectrics, or a combination thereof. In an embodiment, the lower layer 43L and the upper layer 43U may include a silicon oxide layer, and the middle layer 43M may include a silicon nitride layer. In an embodiment, the support 49 may include a polysilicon layer. The fourth interlayer insulating layer 44 may be dielectrics including at least two selected from a group consisting of Si, O, N, B and C. The fourth interlayer insulating layer 44 may include silicon oxide, silicon nitride, silicon oxynitride, or a combination thereof.

The first auxiliary stack structure 53 may be formed on the support 49 and the fourth interlayer insulating layer 44. Each of the plurality of first insulating layers 51 may include a single layer or multiple layers. Each of the plurality of first insulating layers 51 may be dielectrics including for example at least two selected from a group consisting of Si, O, N, B and C. The plurality of first mold layers 52 may include a material having etch selectivity with respect to the plurality of first insulating layers 51. In an embodiment, the plurality of first insulating layers 51 may include silicon oxide, and the plurality of first mold layers 52 may include silicon nitride. An uppermost one of the plurality of first insulating layers 51 may be relatively thicker than remaining ones of the plurality of first insulating layers 51. The stopper 57 may be formed on the first auxiliary stack structure 53. The stopper 57 may include a material having etch selectivity with respect to the uppermost one of the plurality of first insulating layers 51. In an embodiment, the stopper 57 may include silicon nitride.

In an embodiment, at least a part of the element isolation layer 23, the plurality of impurity regions 25, the transistor 27, the plurality of peripheral circuit wiring layers 29, the first interlayer insulating layer 31, the second interlayer insulating layer 32, and the third interlayer insulating layer 33 may be formed under the horizontal wiring layer 41, similarly to the case described with reference to FIG. 1, but description thereof is here omitted for simplicity.

Figure 10:
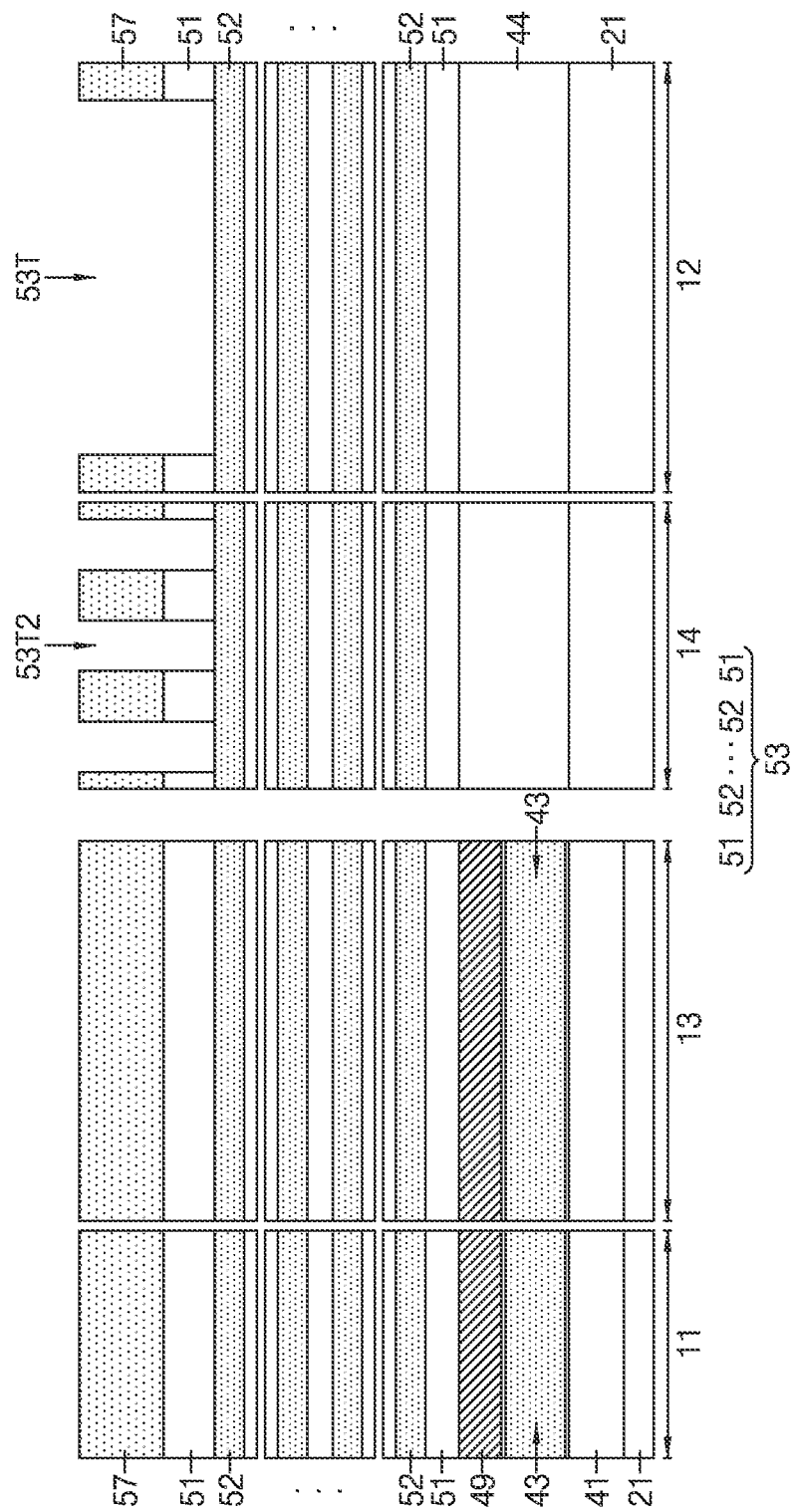

Referring to FIG. 10, the stopper 57 and the first auxiliary stack structure 53 may be patterned, thereby forming a key trench 53T and a plurality of second trenches 53T2. The key trench 53T and the plurality of second trenches 53T2 may have various horizontal widths and various depths. The key trench 53T and the plurality of second trenches 53T2 may extend into the first auxiliary stack structure 53 while extending through the stopper 57.

In an embodiment, the key trench 53T and the plurality of second trenches 53T2 may extend through an uppermost layer of the first auxiliary stack structure 53. The key trench 53T and the plurality of second trenches 53T2 may extend through the uppermost one of the plurality of first insulating layers 51. An uppermost one of the plurality of first mold layers 52 may be exposed to bottoms of the key trench 53T and the plurality of second trenches 53T2. The key trench 53T may be formed in the second area 12, and the plurality of second trenches 53T2 may be formed in the fourth area 14.

Figure 11:
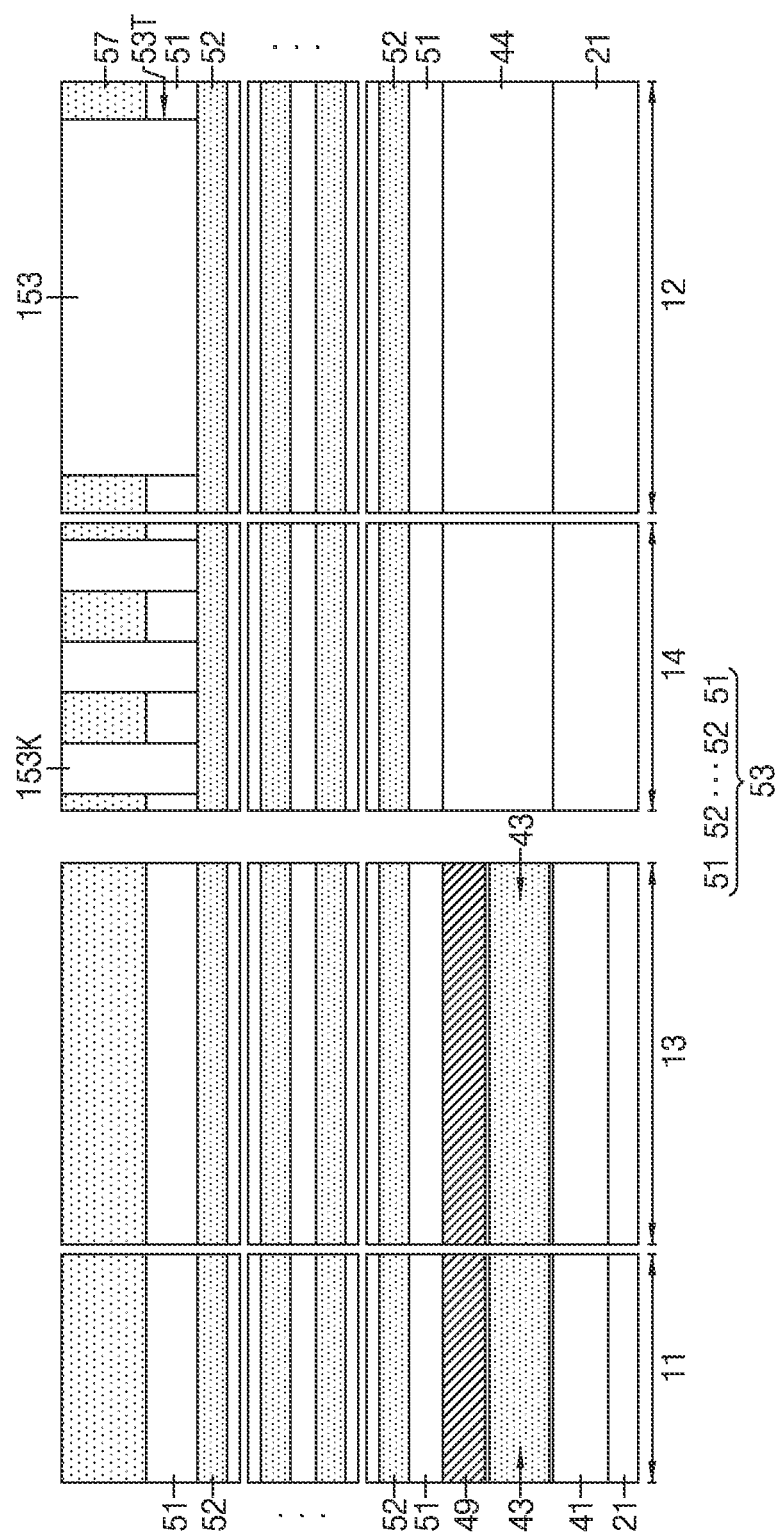

Referring to FIG. 11, an anti-polishing pattern 153 may be formed in the key trench 53T, and may also be formed in the plurality of second trenches 53T2 to form a plurality of one-story keys 153K. Formation of the anti-polishing pattern 153 and the plurality of one-story keys 153K may include a thin film formation process and a planarization process. The planarization process may include a chemical mechanical polishing (CMP) process, an etch-back process, or a combination thereof. The anti-polishing pattern 153 and the plurality of one-story keys 153K may be dielectrics including for example at least two selected from a group consisting of Si, O, N, B and C. For example, the anti-polishing pattern 153 and the plurality of one-story keys 153K may include silicon oxide.

Figure 12:
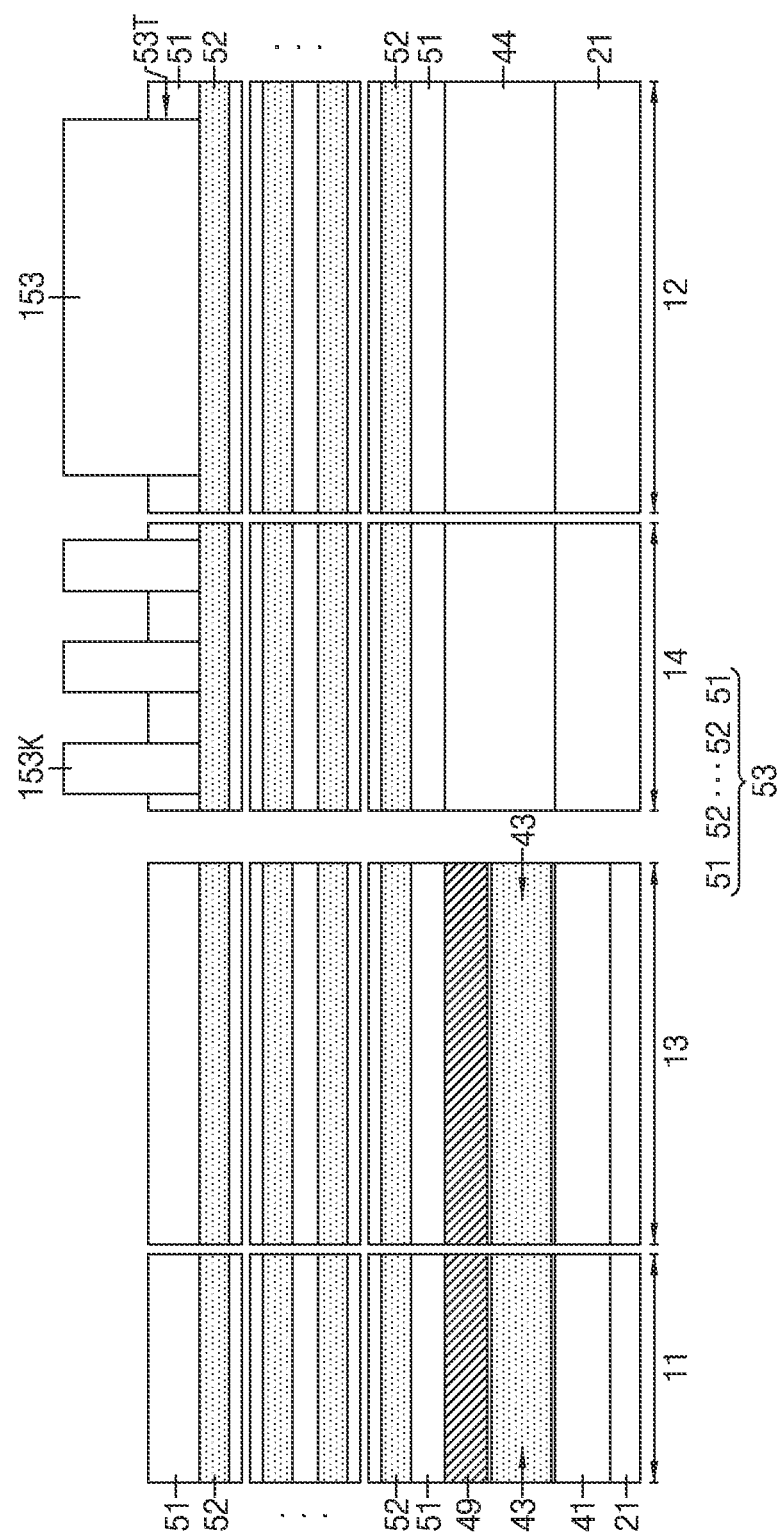

Referring to FIG. 12, the stopper 57 may be removed, thereby exposing side surfaces of the anti-polishing pattern 153 and side surfaces of the plurality of one-story keys 153K. Upper surfaces of the anti-polishing pattern 153 and the plurality of one-story keys 153K may be formed at a higher level than an uppermost end of the first auxiliary stack structure 53.

Figure 13:
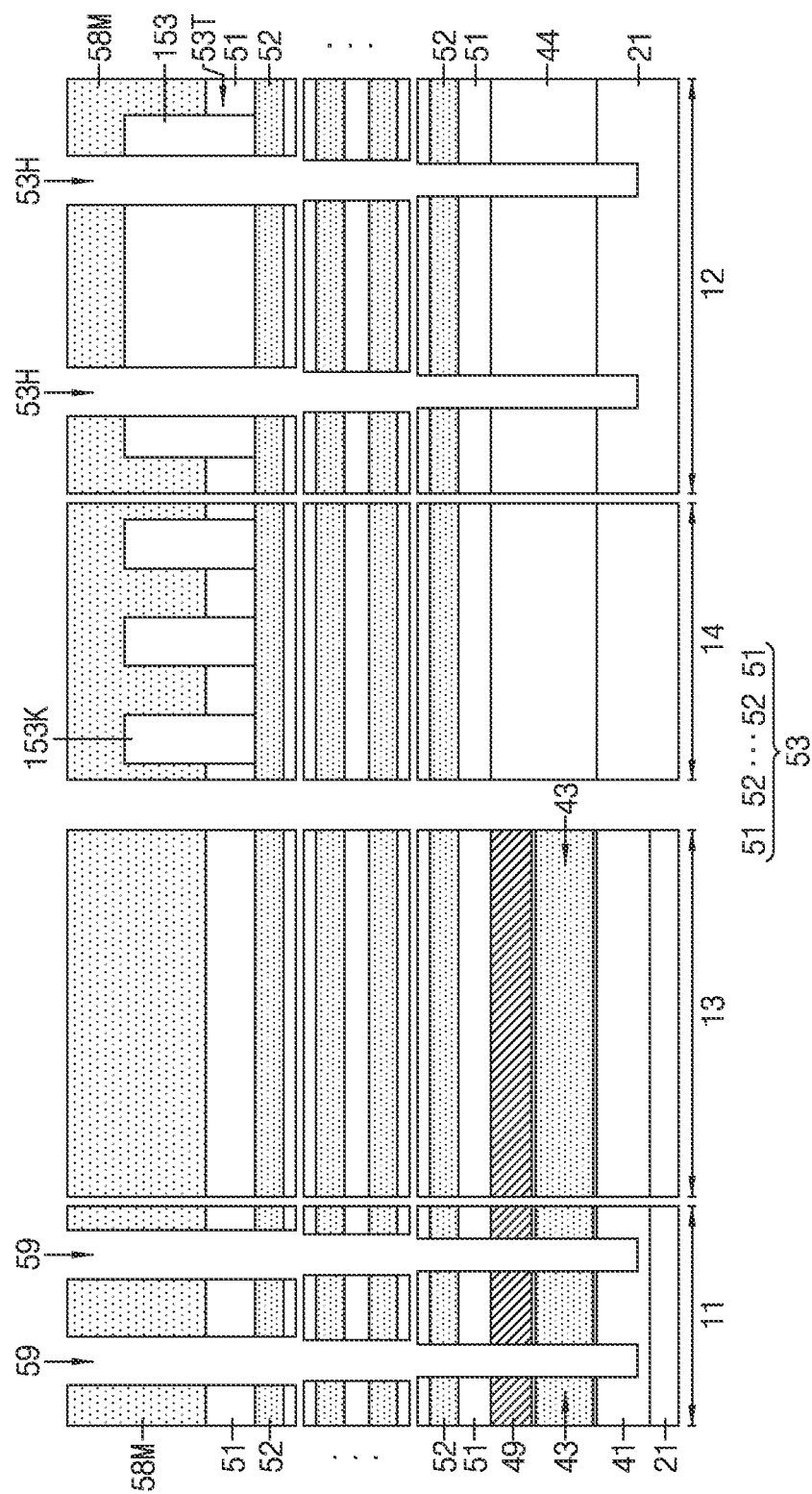

Referring to FIG. 13, a first mask pattern 58M may be formed on the first auxiliary stack structure 53, the anti-polishing pattern 153 and the plurality of one-story keys 153K. A plurality of key holes 53H and a plurality of first channel holes 59 may be formed using the first mask pattern 58M as an etch mask. Formation of the plurality of key holes 53H and the plurality of first channel holes 59 may include an anisotropic etching process. The plurality of first channel holes 59 may be formed in the first area 11. The plurality of key holes 53H may be formed in the second area 12.

The plurality of one-story keys 153K may function as an alignment key for formation of the plurality of first channel holes 59 and the plurality of key holes 53H. The plurality of first channel holes 59 and the plurality of key holes 53H may be aligned referring to the plurality of one-story keys 153K. Each of the plurality of first channel holes 59 may extend into the horizontal wiring layer 41 while extending vertically through the first auxiliary stack structure 53, the support 49, and the connecting mold layer 43. Each of the plurality of key holes 53H may extend into the substrate 21 while extending vertically through the anti-polishing pattern 153, the first auxiliary stack structure 53, and the fourth interlayer insulating layer 44.

In an embodiment, each of the plurality of key holes 53H may have substantially the same horizontal width as each of the plurality of first channel holes 59. Bottoms of the plurality of key holes 53H may be formed at substantially the same level as bottoms of the plurality of first channel holes 59. The minimum distance between the bottoms of the plurality of key holes 53H and the lower surface of the substrate 21 may be substantially equal to the minimum distance between the bottoms of the plurality of first channel holes 59 and the lower surface of the substrate 21. Each of the plurality of key holes 53H and the plurality of first channel holes 59 may have a horizontal width gradually decreasing while extending downwards.

Figure 14:
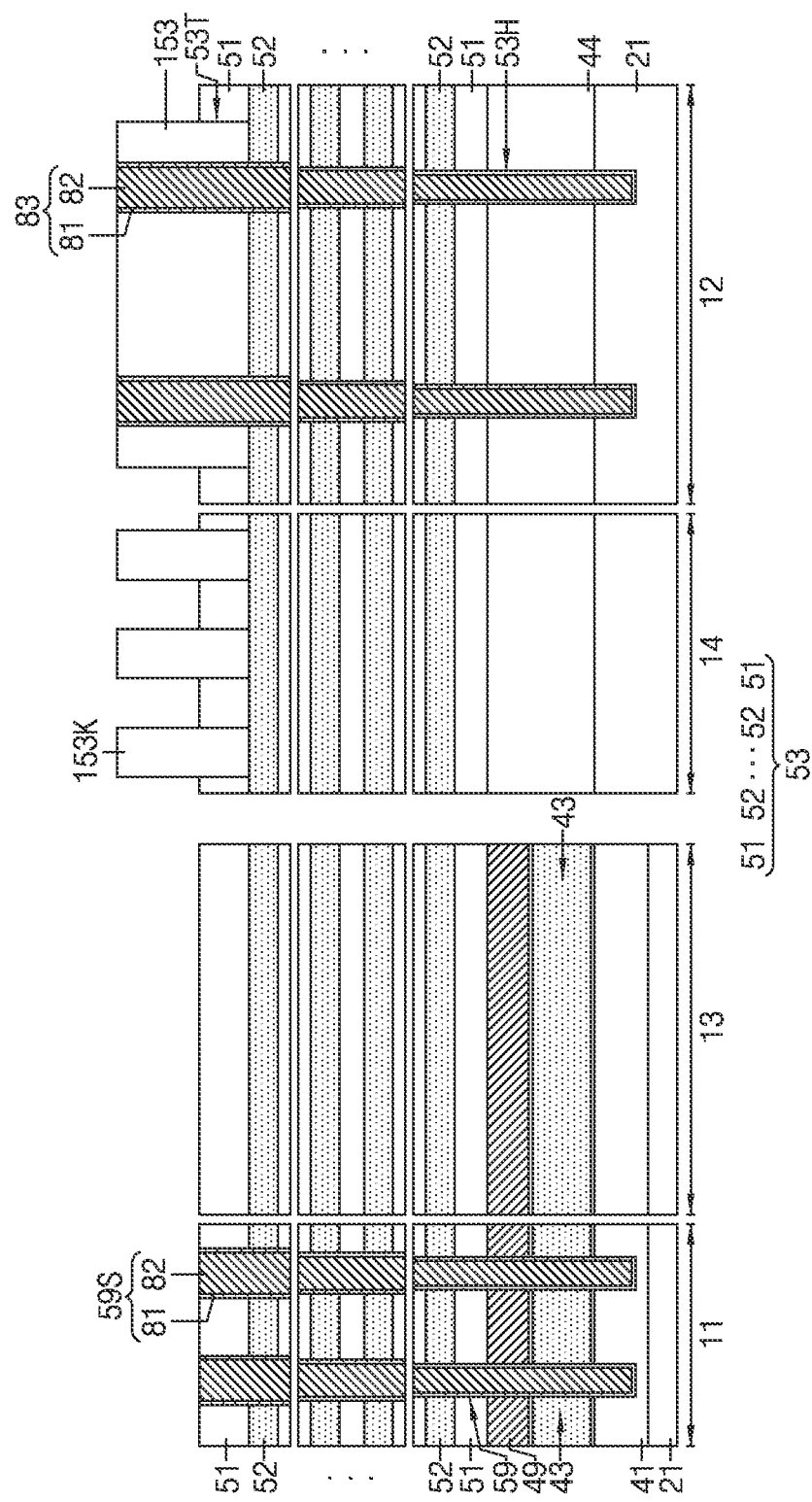

Referring to FIG. 14, a plurality of first sacrificial channel structures 59S may be formed in the plurality of first channel holes 59, and a plurality of alignment keys 83 may be formed in the plurality of key holes 53H. The first mask pattern 58M may be removed. Each of the plurality of first sacrificial channel structures 59S and the plurality of alignment keys 83 may include a liner 81 and a buried layer 82.

Formation of the plurality of first sacrificial channel structures 59S and the plurality of alignment keys 83 may include a plurality of thin film formation processes and a planarization process. The planarization process may include a chemical mechanical polishing (CMP) process, an etch-back process, or a combination thereof. The plurality of alignment keys 83 may include a material layer identical to that of each of the plurality of first sacrificial channel structures 59S while being formed simultaneously therewith. The liner 81 may surround a side surface and a bottom of the buried layer 82. In an embodiment, the liner 81 may include silicon nitride, and the buried layer 82 may include polysilicon. In an embodiment, the plurality of alignment keys 83 and the plurality of first sacrificial channel structures 59S may include a W layer.

Upper surfaces of the plurality of first sacrificial channel structures 59S and the first auxiliary stack structure 53 may be substantially coplanar. An upper surface of the anti-polishing pattern 153 and the upper surfaces of the plurality of alignment keys 83 may be coplanar. The upper surfaces of the anti-polishing pattern 153 and the plurality of alignment keys 83 may protrude to a higher level than the upper surfaces of the plurality of first sacrificial channel structures 59S and the first auxiliary stack structure 53. The anti-polishing pattern 153 may function to determine a height of the plurality of alignment keys 83.

Figure 15:
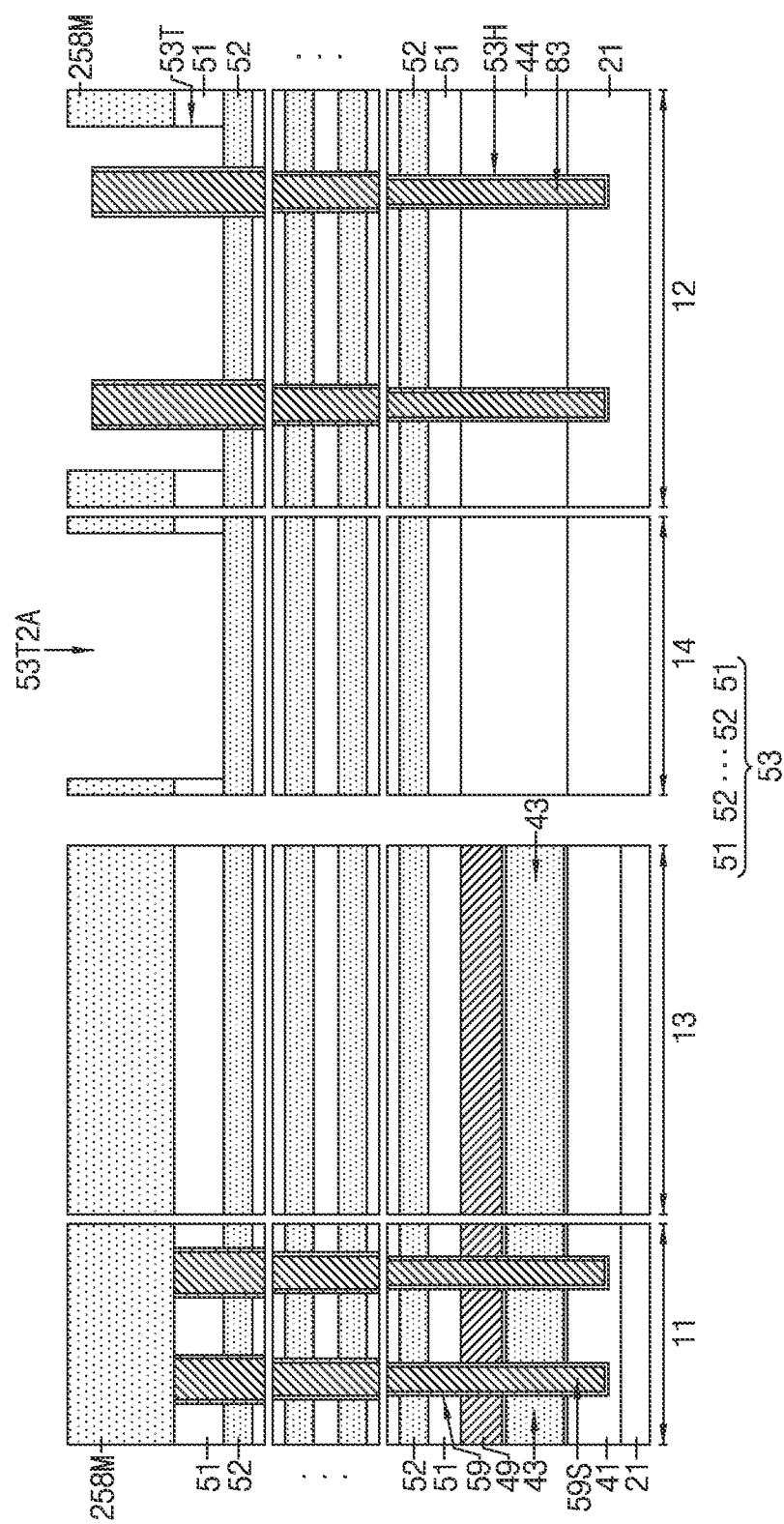

Referring to FIG. 15, a second mask pattern 258M may be formed on the plurality of first sacrificial channel structures 59S and the first auxiliary stack structure 53. The anti-polishing pattern 153 may be removed using the second mask pattern 258M as an etch mask, thereby exposing the plurality of alignment keys 83 in the key trench 53T. The one-story keys 153K may be removed using the second mask pattern 258M as an etch mask and, as such, an enlarged second trench 53T2A may be formed.

Figure 16:
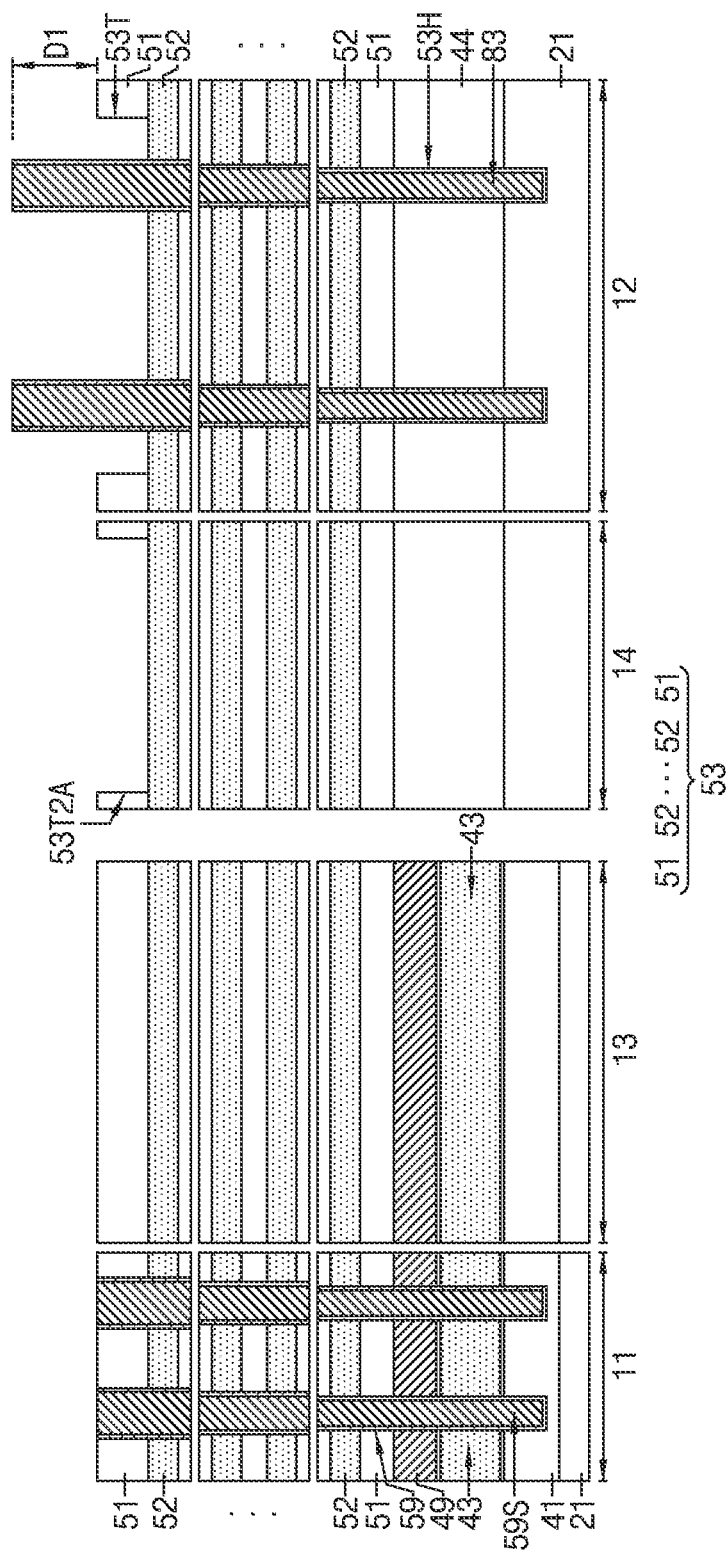

Referring to FIG. 16, the second mask pattern 258M may be removed. Each of the plurality of alignment keys 83 may protrude to a higher level than the upper surface of the first auxiliary stack structure 53. The minimum distance between an uppermost end of the first auxiliary stack structure 53 and an uppermost end of each of the plurality of alignment keys 83 may be represented by a first length D1. The first length D1 may be 1 to 100 nm. In an embodiment, the first length D1 may be about 50 nm.

Figure 17:
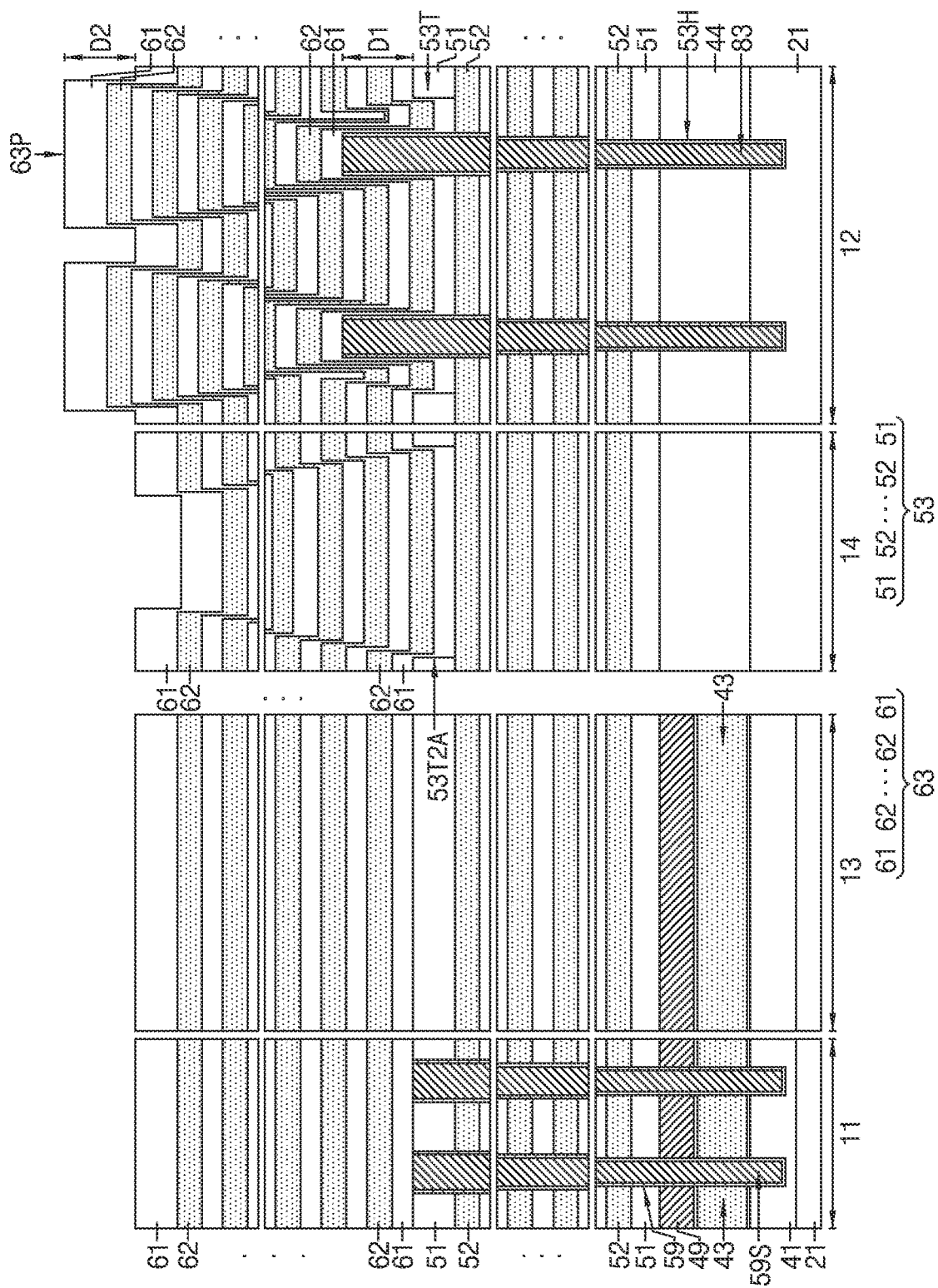

Referring to FIG. 17, a second auxiliary stack structure 63 may be formed on the first auxiliary stack structure 53 and the plurality of alignment keys 83. The second auxiliary stack structure 63 may include a plurality of second insulating layers 61 and a plurality of second mold layers 62 which are repeatedly and alternately stacked.

Each of the plurality of second insulating layers 61 may include dielectrics including for example at least two selected from a group consisting of Si, O, N, B and C. The plurality of second mold layers 62 may include a material having etch selectivity with respect to the plurality of second insulating layers 61. In an embodiment, the plurality of second insulating layers 61 may include substantially the same material as the plurality of first insulating layers 51, and the plurality of second mold layers 62 may include substantially the same material as the plurality of first mold layers 52. The plurality of second insulating layers 61 may include silicon oxide, and the plurality of second mold layers 62 may include silicon nitride. An uppermost one of the plurality of second insulating layers 61 may be relatively thicker than remaining ones of the plurality of second insulating layers 61.

The second auxiliary stack structure 63 in the second area 12 may include a plurality of protrusions 63P. The plurality of protrusions 63P are aligned on the plurality of alignment keys 83. An uppermost end of each of the plurality of protrusions 63P may be formed at a higher level than an upper surface of the second auxiliary stack structure 63 in the first area 11 by a second length D2. The second length D2 may be determined by the first length D1. The second length D2 may be 1 to 100 nm. In an embodiment, the second length D2 may be about 50 nm.

Figure 18:
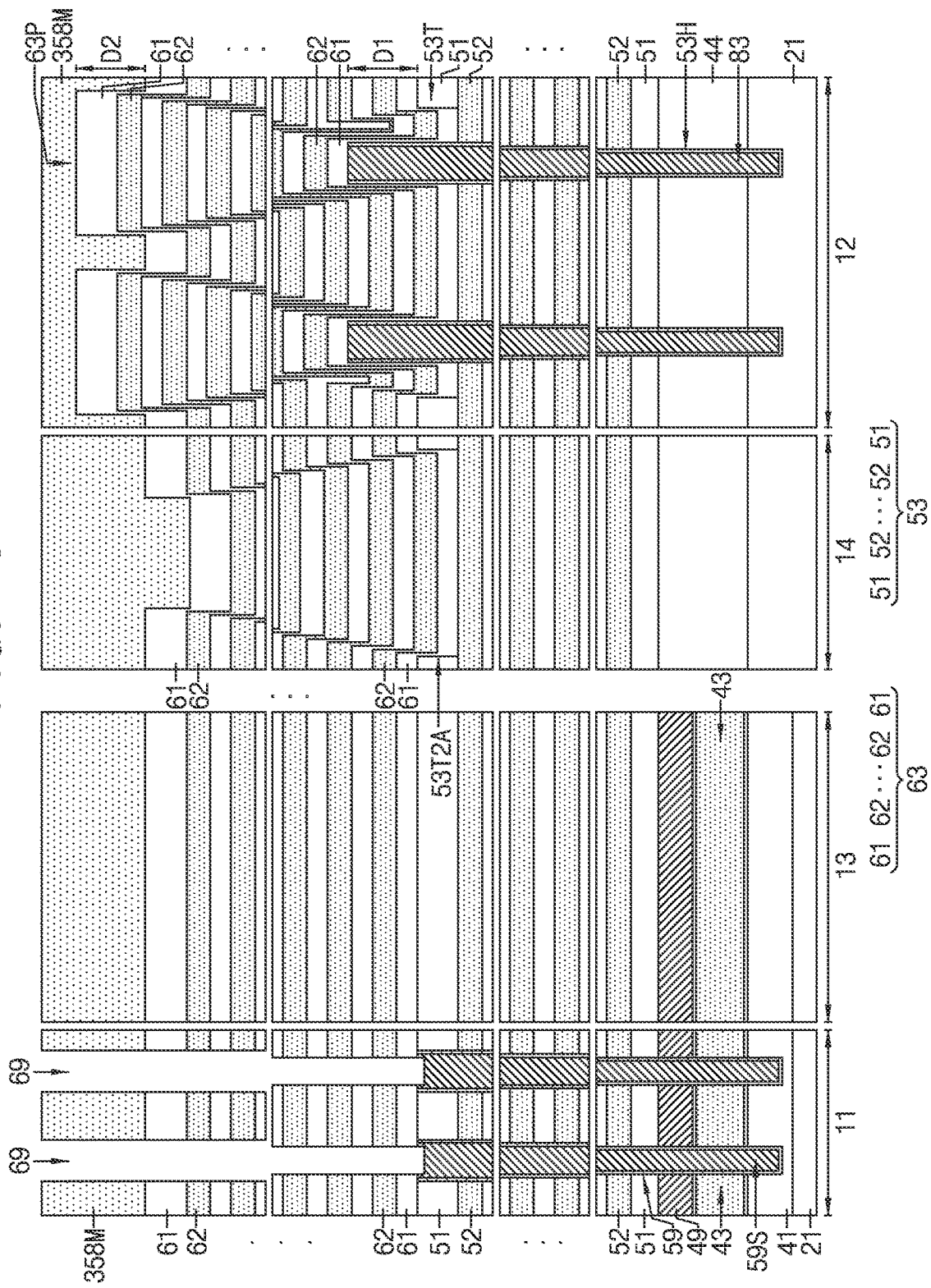

Referring to FIG. 18, a third mask pattern 358M may be formed on the second auxiliary stack structure 63. A plurality of second channel holes 69 extending through the second auxiliary stack structure 63 may be formed using the third mask pattern 358M as an etch mask. Each of the plurality of second channel holes 69 may communicate with a corresponding one of the plurality of first channel holes 59. Each of the plurality of second channel holes 69 may have a horizontal width gradually decreasing while extending downwards. Each of the plurality of second channel holes 69 may have a smaller horizontal width at a lower end thereof than at an upper end of a corresponding one of the plurality of first channel holes 59.

The plurality of protrusions 63P and the plurality of alignment keys 83 may function as an alignment key for formation of the plurality of second channel holes 69. The plurality of second channel holes 69 may be aligned referring to the plurality of protrusions 63P, the plurality of alignment keys 83, or a combination thereof.

Figure 19:
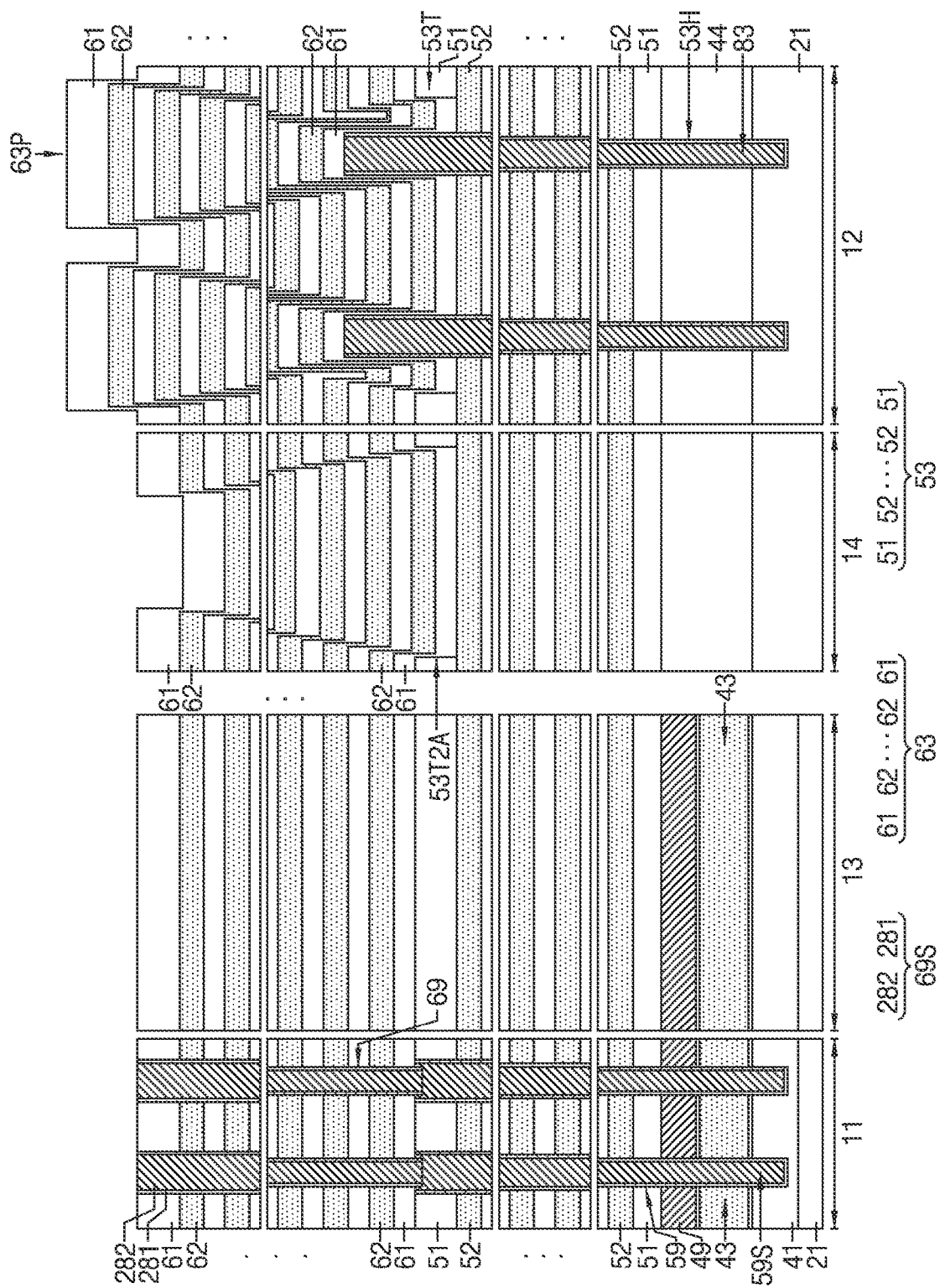

Referring to FIG. 19, a plurality of second sacrificial channel structures 69S may be formed in the plurality of second channel holes 69. Each of the plurality of second sacrificial channel structures 69S may include an upper liner 281 and an upper buried layer 282. The third mask pattern 358M may be removed.

The upper liner 281 may surround a side surface of the upper buried layer 282. The upper liner 281 may include substantially the same material as the liner 81, and the upper buried layer 282 may include substantially the same material as the buried layer 82. In an embodiment, the upper liner 281 may include silicon nitride, and the upper buried layer 282 may include polysilicon. In an embodiment, the plurality of second sacrificial channel structures 69S may include a W layer.

Figure 20:
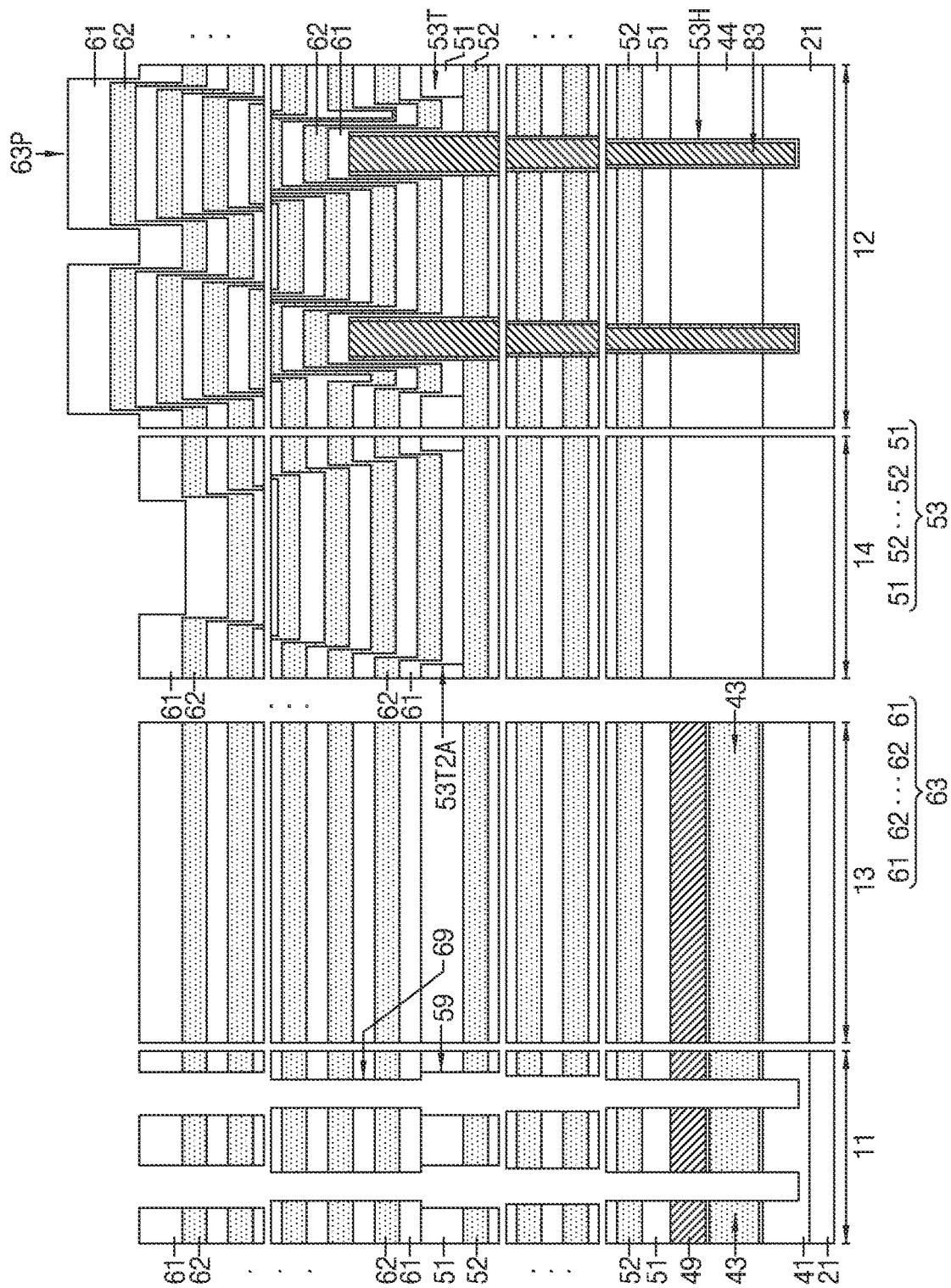

Referring to FIG. 20, the plurality of second sacrificial channel structures 69S and the plurality of first sacrificial channel structures 59S may be removed, thereby exposing the second auxiliary stack structure 63, the first auxiliary stack structure 53, the support 49, the connecting mold layer 43, and the horizontal wiring layer 41 in the plurality of second channel holes 69 and the plurality of first channel holes 59. Each of the plurality of the second channel holes 69 may communicate with a corresponding one of the plurality of first channel holes 59.

Figure 21:
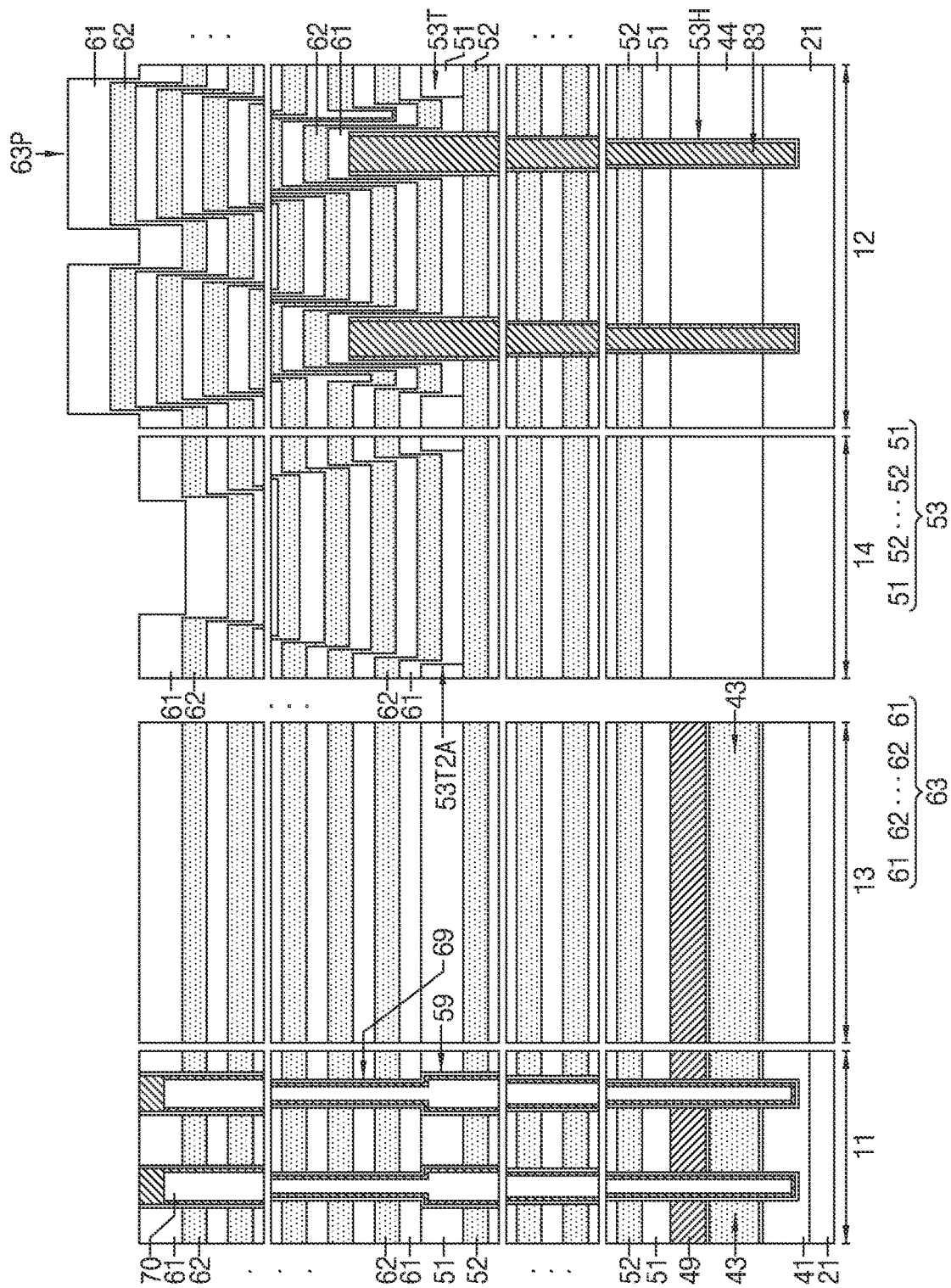

Referring to FIG. 21, a plurality of channel structures 70 may be formed in the plurality of second channel holes 69 and the plurality of first channel holes 59. The plurality of channel structures 70 may include a configuration similar to the configuration described with reference to FIGS. 1 to 3.

Figure 22:
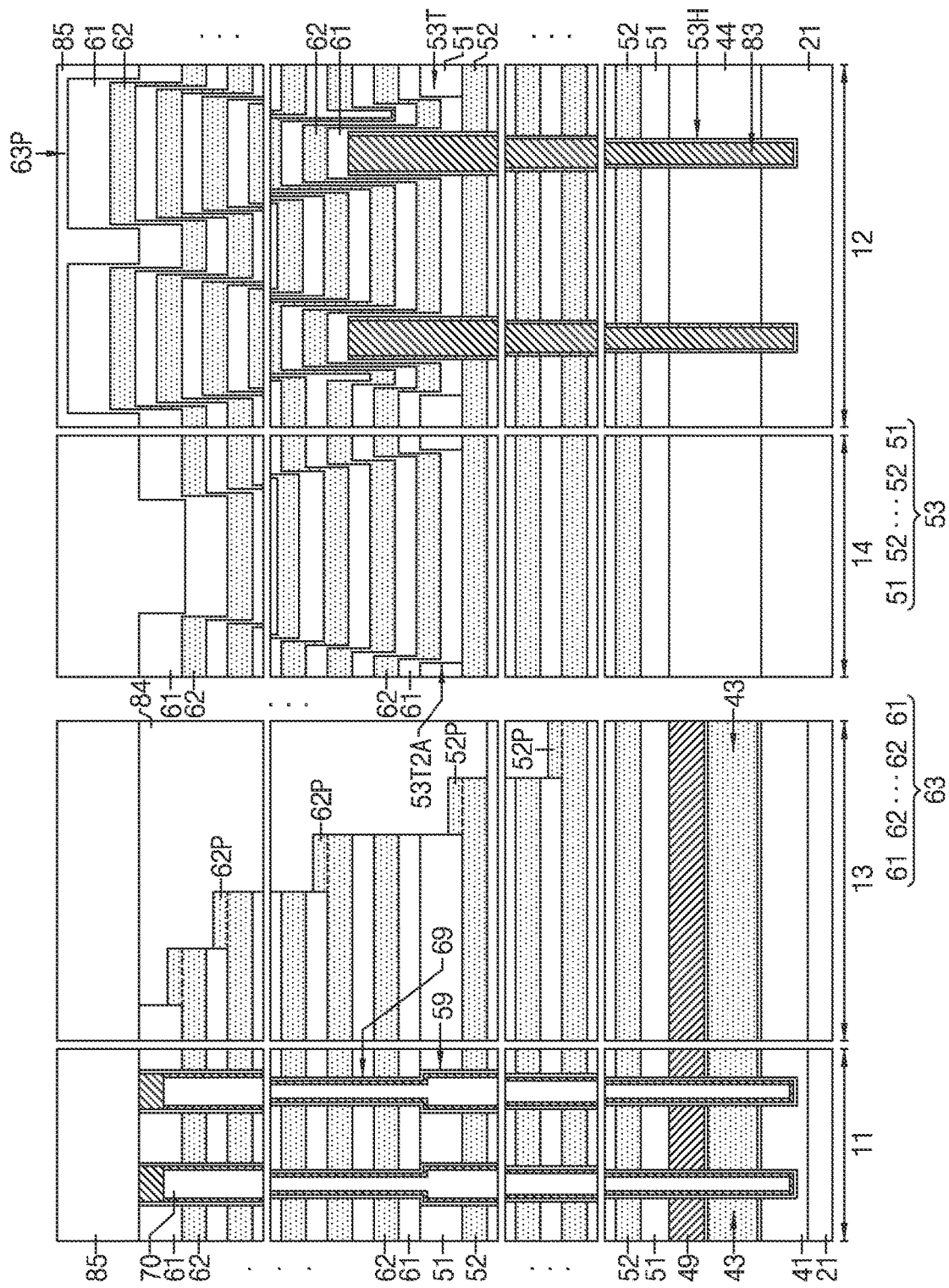

Referring to FIG. 22, a plurality of first temporary pads 52P and a plurality of second temporary pads 62P may be formed in the third area 13. Each of the plurality of first temporary pads 52P may be in continuity with a side surface of a corresponding one of the plurality of first mold layers 52, and each of the plurality of second temporary pads 62P may be in continuity with a side surface of a corresponding one of the plurality of second mold layers 62.

Each of the plurality of first temporary pads 52P may be thicker than the corresponding one of the plurality of first mold layers 52, and each of the plurality of second temporary pads 62P may be thicker than the corresponding one of the plurality of second mold layers 62. The plurality of first temporary pads 52P may include substantially the same material as the plurality of first mold layers 52, and the plurality of second temporary pads 62P may include substantially the same material as the plurality of second mold layers 62. The plurality of first temporary pads 52P and the plurality of second temporary pads 62P may include a staircase shape.

A pad insulating layer 84 may be formed on the plurality of first temporary pads 52P and the plurality of second temporary pads 62P. The pad insulating layer 84 may include dielectrics including for example at least two selected from a group consisting of Si, O, N, B and C. In an embodiment, the pad insulating layer 84 may include a material having etch selectivity with respect to the plurality of first mold layers 52, the plurality of second mold layers 62, the plurality of first temporary pads 52P, and the plurality of second temporary pads 62P. The pad insulating layer 84 may include silicon oxide.

A fifth interlayer insulating layer 85 may be formed to cover the plurality of channel structures 70, the second auxiliary stack structure 63, and the pad insulating layer 84. The fifth interlayer insulating layer 85 may include for example dielectrics including at least two selected from a group consisting of Si, O, N, B and C. In an embodiment, the fifth interlayer insulating layer 85 may include silicon oxide, silicon nitride, silicon oxynitride, or a combination thereof.

Figure 23:
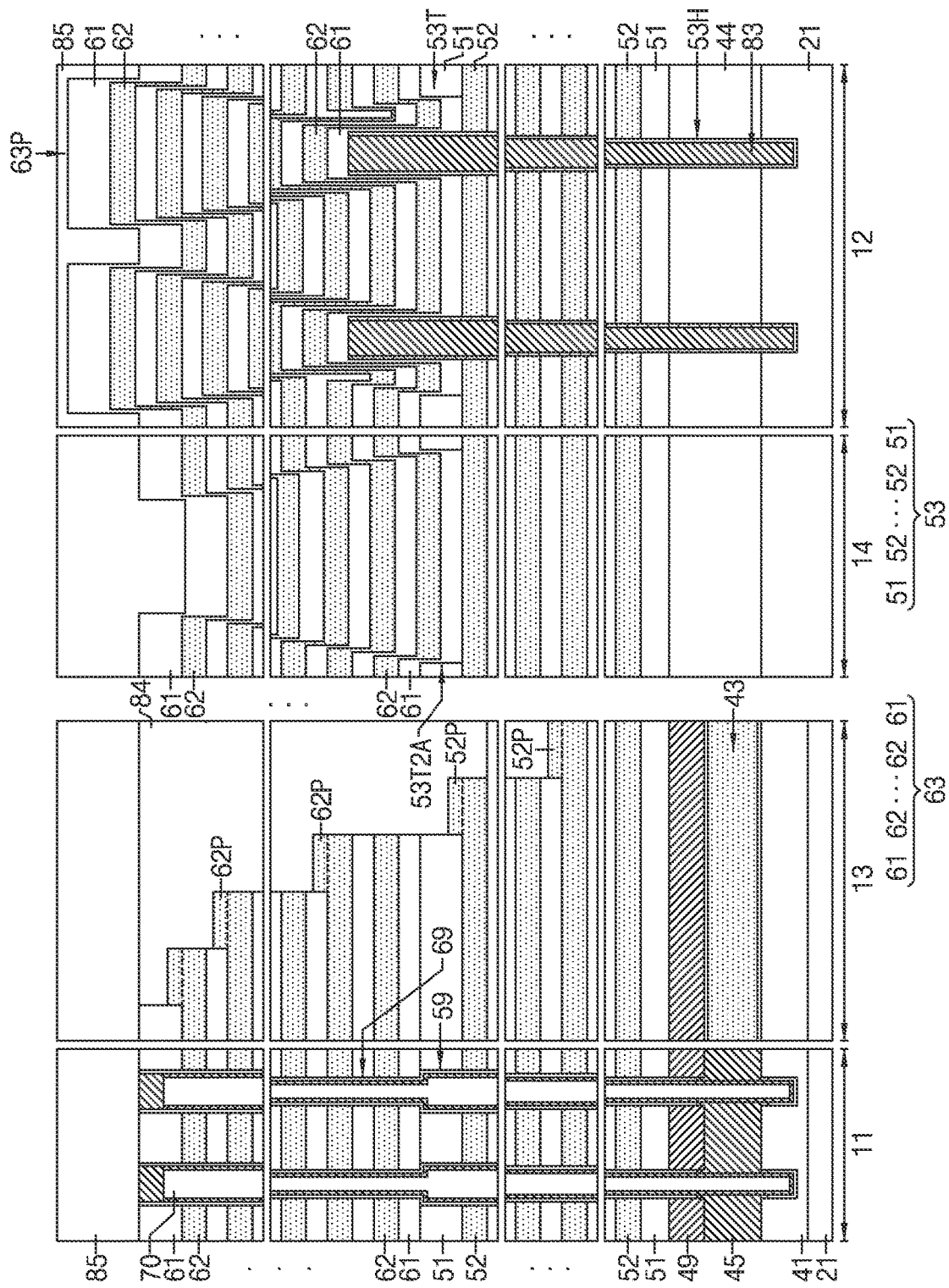

Referring to FIG. 23, the connecting mold layer 43 in the first area 11 may be removed, and a sealing conductive layer 45 may then be formed. The sealing conductive layer 45 may be formed between the horizontal wiring layer 41 and the support 49. The sealing conductive layer 45 may include a configuration similar to the configuration described with reference to FIG. 3. The connecting mold layer 43 may be preserved between the horizontal wiring layer 41 and the support 49 in the third area 13.

The sealing conductive layer 45 may include a conductive material such as metal, metal nitride, metal oxide, metal silicide, conductive carbon, polysilicon, amorphous silicon, monocrystalline silicon, or a combination thereof. In an embodiment, the sealing conductive layer 45 may include a doped polysilicon layer.

Figure 24:
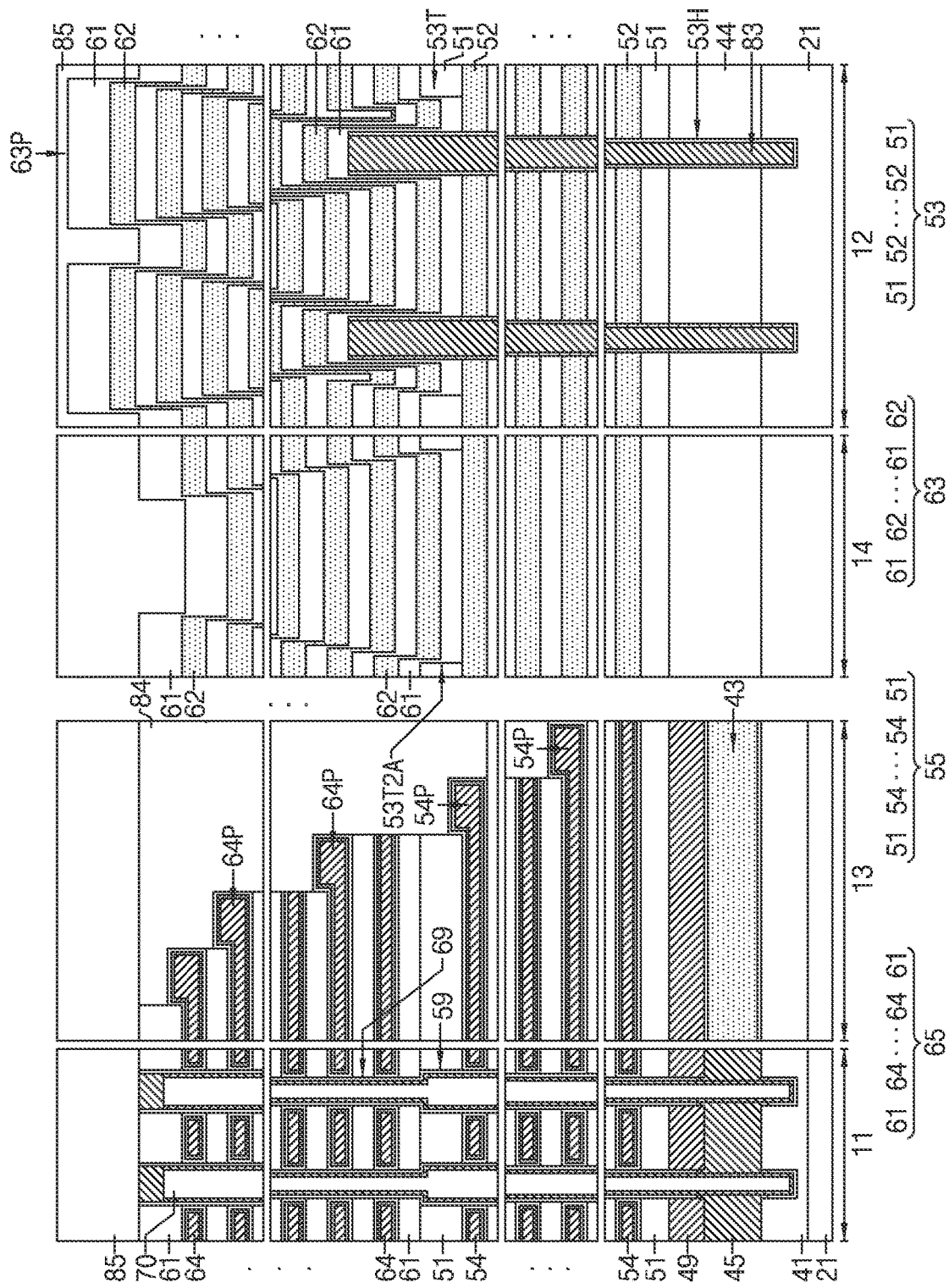

Referring to FIG. 24, the plurality of first mold layers 52, the plurality of first temporary pads 52P, the plurality of second mold layers 62, and the plurality of second temporary pads 62P in the first area 11 and the third area 13 may be removed, and a plurality of first wiring layers 54, a plurality of first pads 54P, a plurality of second wiring layers 64, and a plurality of second pads 64P may then be formed. Each of the plurality of first pads 54P may be in continuity with a surface of a corresponding one of the plurality of first wiring layers 54. Each of the plurality of second pads 64P may be in continuity with a surface of a corresponding one of the plurality of second wiring layers 64.

The plurality of first wiring layers 54, the plurality of first pads 54P, the plurality of second wiring layers 64, and the plurality of second pads 64P may have configurations similar to the configurations described with reference to FIGS. 2 and 3. The plurality of first insulating layers 51 and the plurality of first wiring layers 54, which are repeatedly and alternately stacked, may constitute a first stack structure 55. The plurality of second insulating layers 61 and the plurality of second wiring layers 64, which are repeatedly and alternately stacked, may constitute a second stack structure 65.

Figure 25:
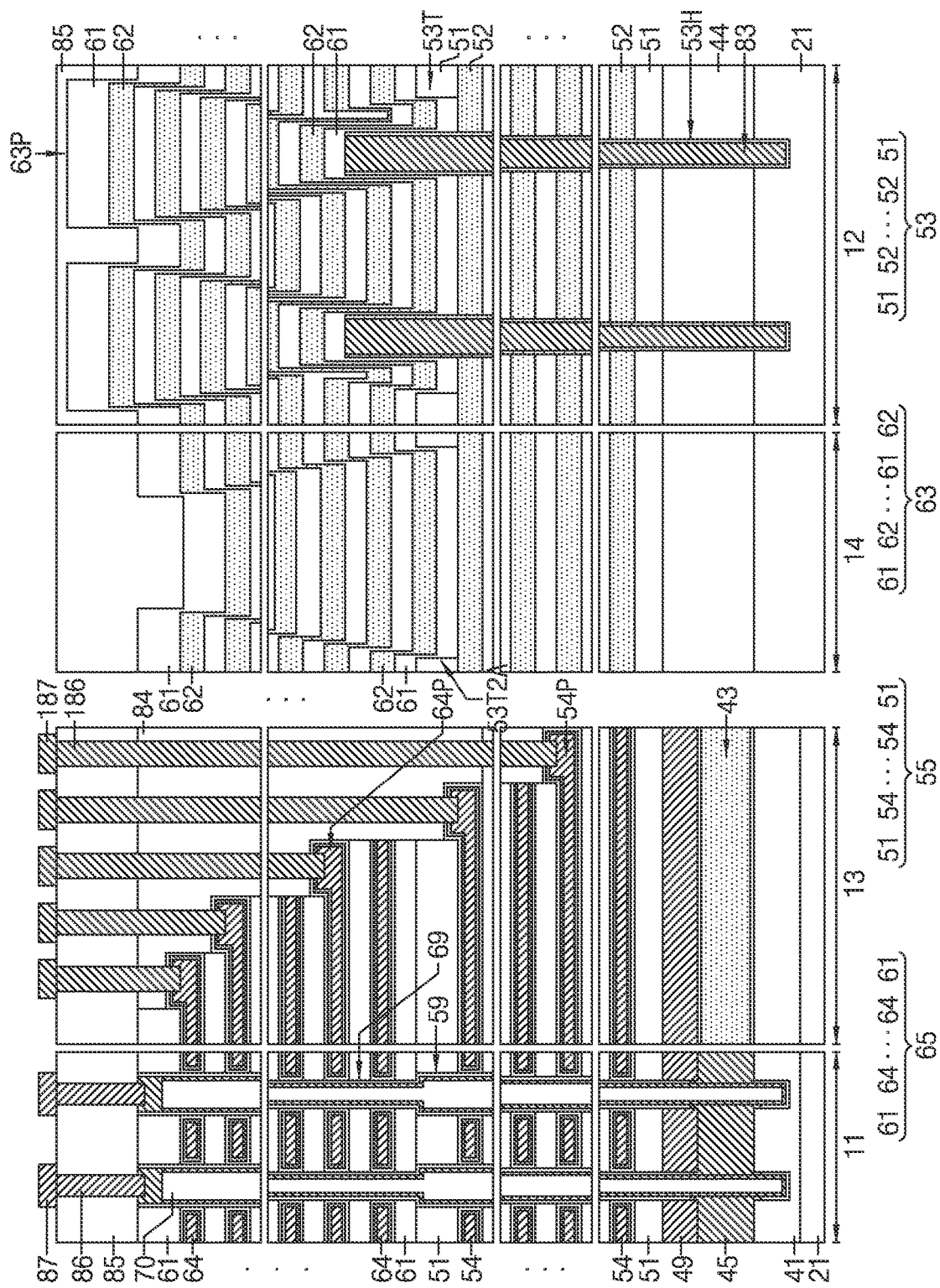

Referring to FIG. 25, a plurality of bit plugs 86, a plurality of bit lines 87, a plurality of cell contact plugs 186, and a plurality of relay wiring layers 187 may be formed in the first area 11 and the third area 13. The plurality of bit plugs 86, the plurality of bit lines 87, the plurality of cell contact plugs 186, and the plurality of relay wiring layers 187 may include a conductive material such as for example metal, metal nitride, metal oxide, metal silicide, conductive carbon, polysilicon, amorphous silicon, monocrystalline silicon, or a combination thereof.

The plurality of bit plugs 86 may be electrically connected to the plurality of channel structures 70 while extending through the fifth interlayer insulating layer 85 in the first area 11. The plurality of bit plugs 86 and the plurality of channel structures 70 may include configurations similar to the configurations described with reference to FIG. 2. The plurality of bit lines 87 may be formed on the fifth interlayer insulating layer 85 in the first area 11. The plurality of bit lines 87 may contact the plurality of bit plugs 86.

The plurality of cell contact plugs 186 may be electrically connected to the plurality of first pads 54P and the plurality of second pads 64P while extending through the fifth interlayer insulating layer 85 and the pad insulating layer 84 in the third area 13. The plurality of relay wiring layers 187 may be formed on the fifth interlayer insulating layer 85 in the third area 13. The plurality of relay wiring layers 187 may contact the plurality of cell contact plugs 186.

Figure 26:
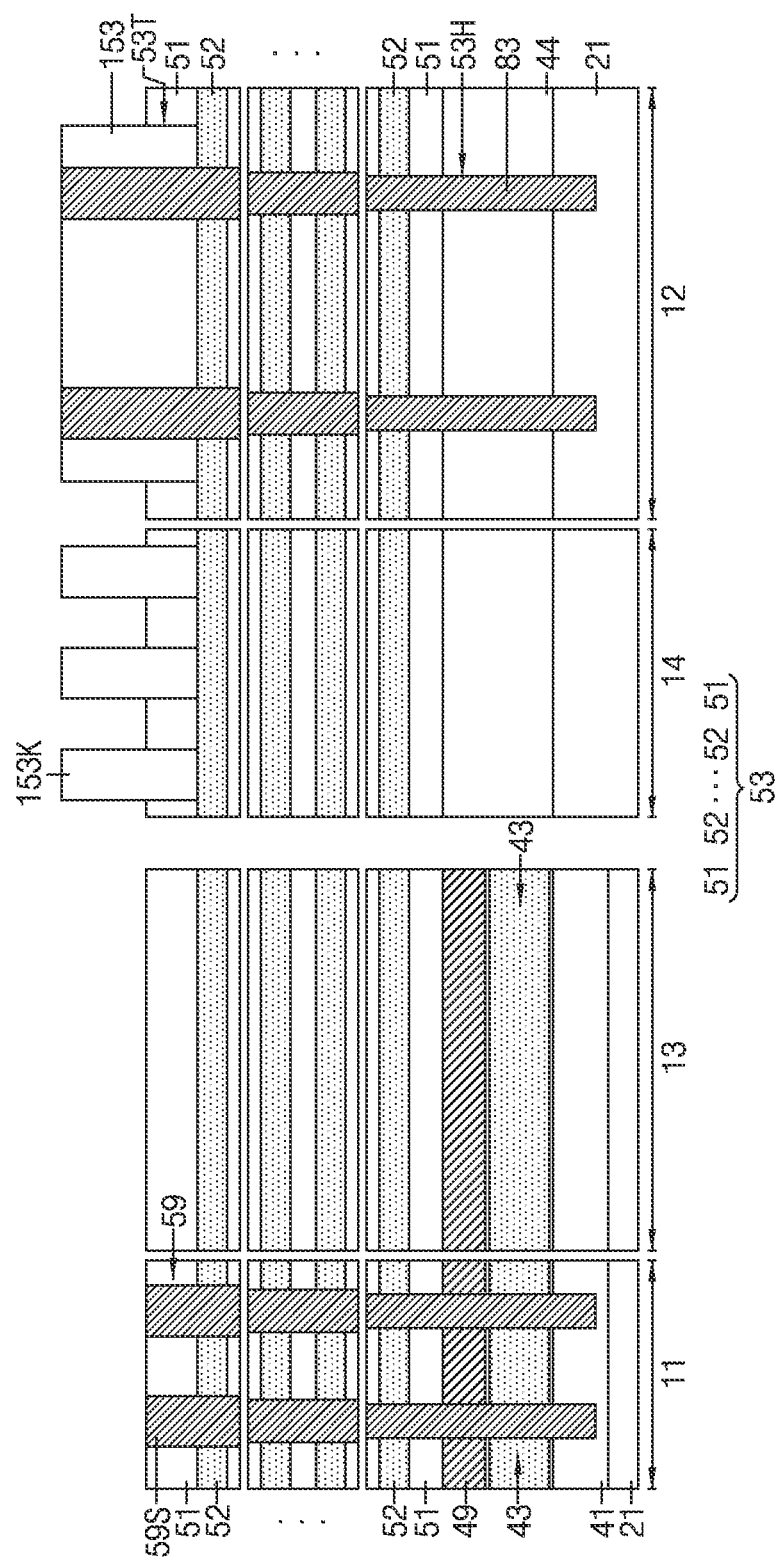

FIG. 26 illustrates a sectional view explanatory of a semiconductor device formation method according to embodiments of the inventive concepts. For example, FIG. 26 may be explanatory of a formation method of the semiconductor device shown in FIG. 4. The processes as described hereinafter referring to FIG. 26 may for example be performed on the structure shown in FIG. 13 in place of the processes described referring to FIG. 14.

Referring to FIG. 26, a plurality of first sacrificial channel structures 59S and a plurality of alignment keys 83 including a single layer may be respectively formed in the first channel holes 59 and the key holes 53H. The plurality of first sacrificial channel structures 59S and the plurality of alignment keys 83 may include a W layer, a polysilicon layer, or a silicon nitride layer. Description of other aspects of the semiconductor device formation method of FIG. 26 that are similar to FIG. 14 are here omitted for simplicity.

Figure 27:
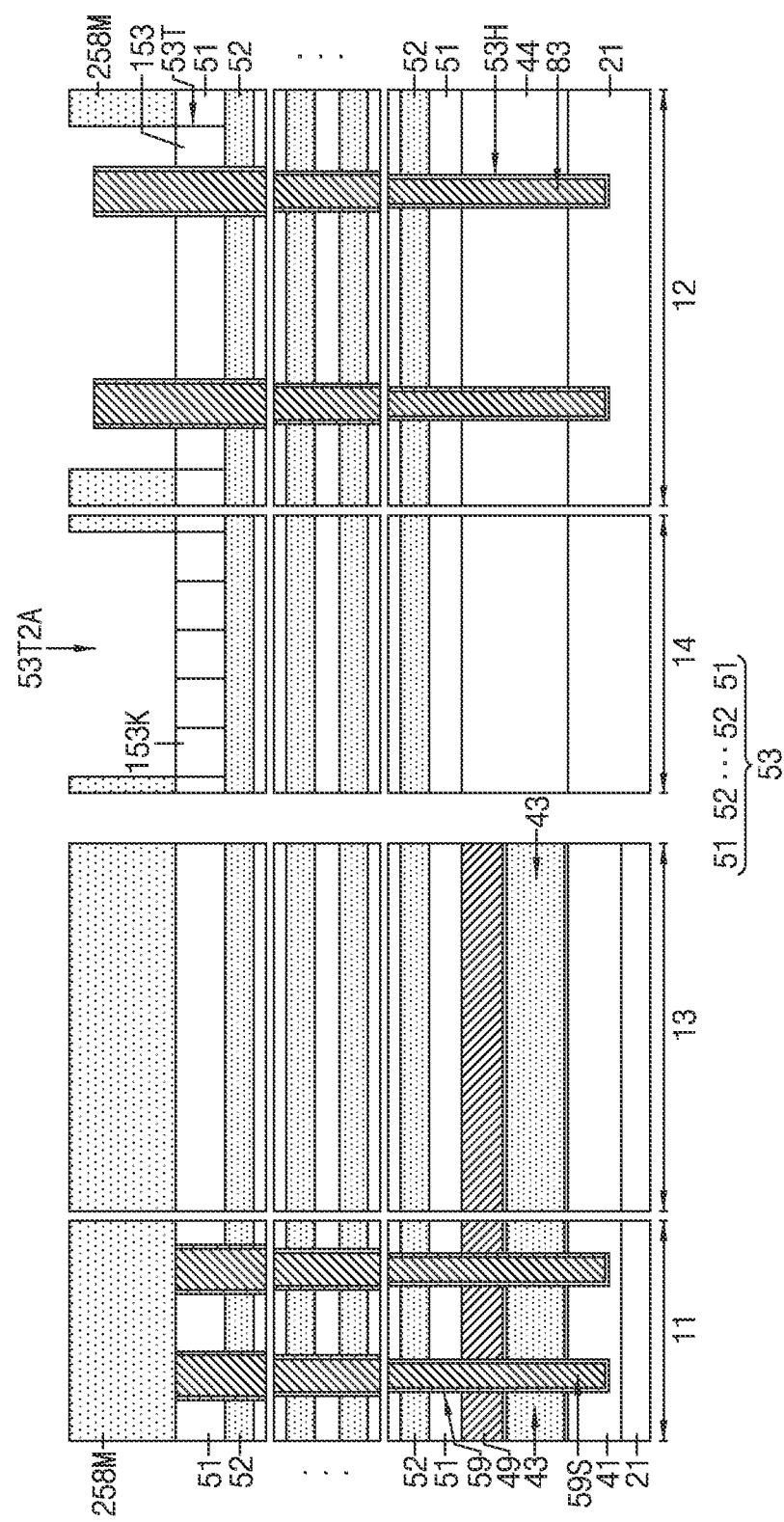

FIG. 27 illustrates a sectional view explanatory of a semiconductor device formation method according to embodiments of the inventive concepts. For example, FIG. 27 may be explanatory of a formation method of the semiconductor device shown in FIG. 5. The processes as described hereinafter referring to FIG. 27 may for example be performed on the structure shown in FIG. 14 in place of the processes described referring to FIG. 15.

Referring to FIG. 27, an anti-polishing pattern 153 may be preserved in a key trench 53T, and a plurality of one-story keys 153K may be preserved in an enlarged second trench 53T2A by partially etching the anti-polishing pattern 153 using the second mask pattern 258M. In an embodiment, upper surfaces of the anti-polishing pattern 153 and the first auxiliary stack structure 53 may be substantially coplanar. Description of other aspects of the semiconductor device formation method of FIG. 27 that are similar to FIG. 15 are here omitted for simplicity.

Figure 28:
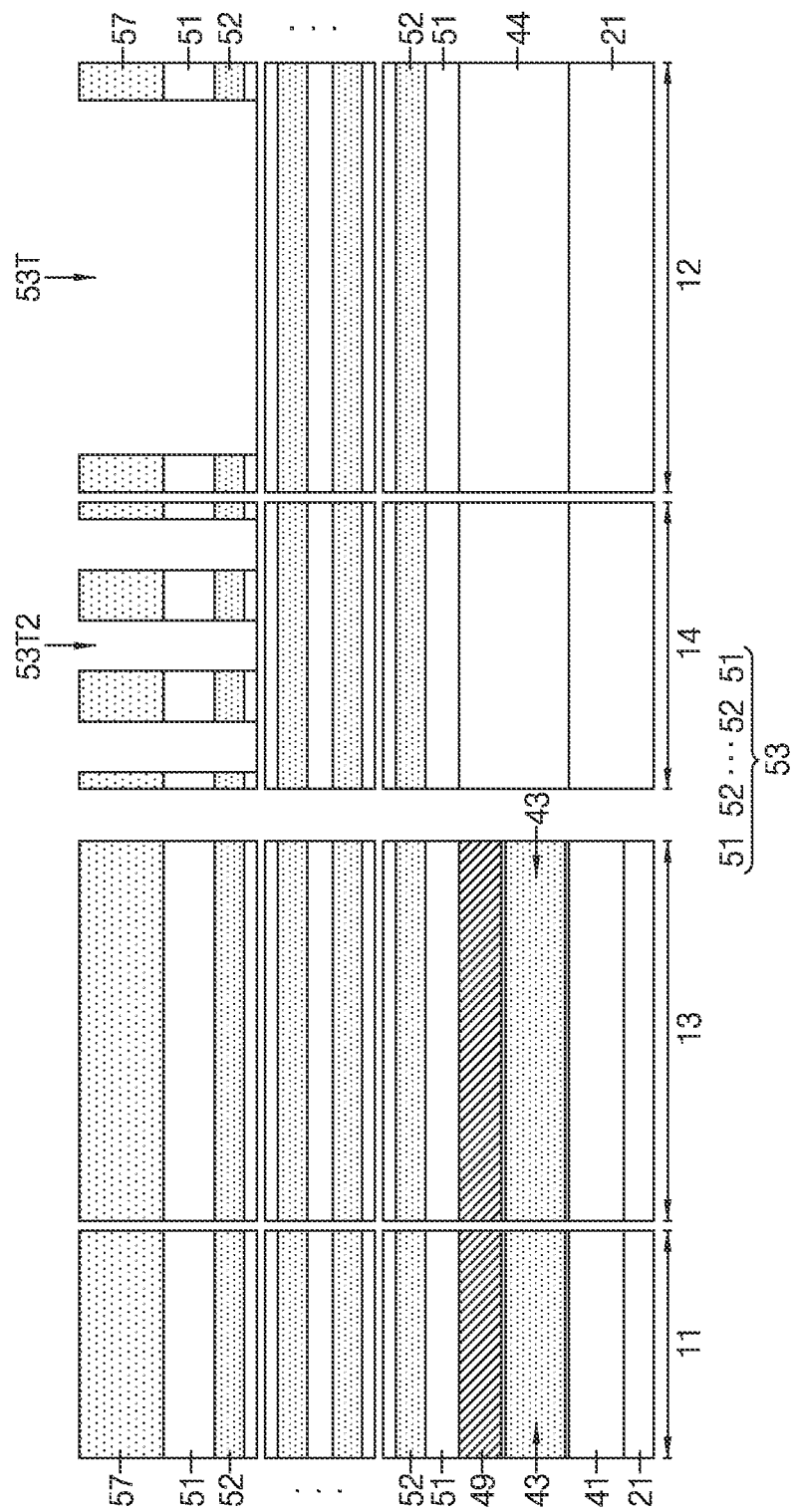

FIG. 28 illustrates a sectional view explanatory of a semiconductor device formation method according to embodiments of the inventive concepts. For example, FIG. 28 may be explanatory of a formation method of the semiconductor device shown in FIG. 6. The processes as described hereinafter referring to FIG. 28 may for example be performed on the structure shown in FIG. 9 in place of the processes described referring to FIG. 10.

Referring to FIG. 28, a key trench 53T and a plurality of second trenches 53T2 may for example be etched to have greater depth than shown in FIG. 10. In the embodiment shown in FIG. 28, the key trench 53T and the plurality of second trenches 53T2 may extend into a first auxiliary stack structure 53 while extending through at least one of the plurality of first insulating layers 51 and at least one of the plurality of first mold layers 52. In other embodiments, the key trench 53T and the plurality of second trenches 53T2 may extend through more layers of the first auxiliary stack structure 53 as shown in FIG. 28.

Figure 29:
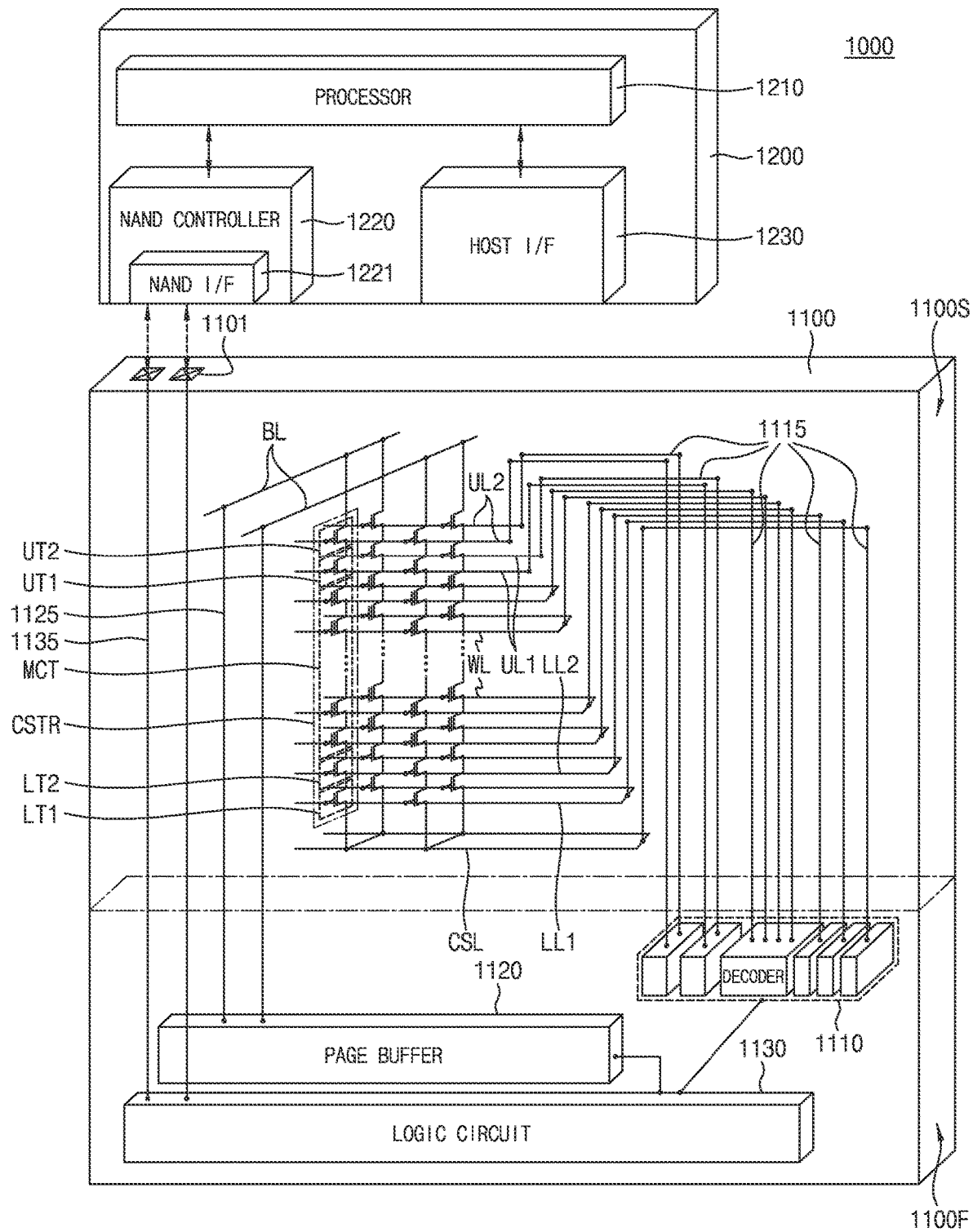
FIG. 29 illustrates a schematic view of an electronic system including semiconductor devices according to embodiments of the inventive concepts.

FIG. 29 illustrates a schematic view of an electronic system including semiconductor devices according to embodiments of the inventive concepts.

Referring to FIG. 29, an electronic system 1000 according to embodiments of the inventive concepts may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. For example, the electronic system 1000 may be a solid state drive (SSD) device, a universal serial bus (USB) thumb drive, a computing system, a medical device or a communication device which includes one semiconductor device 1100 or a plurality of semiconductor devices 1100.

The semiconductor device 1100 may be a non-volatile memory device. For example, the semiconductor device 1100 may include a semiconductor device described with reference to FIGS. 1 to 28. The semiconductor device 1100 may include a first structure 1110F, and a second structure 1100S on the first structure 1110F. In exemplary embodiments, the first structure 1110F may be disposed at one side of the second structure 1100S. The first structure 1110F may be a peripheral circuit structure including a decoder circuit 1110, a page buffer 1120 and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit lines BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be diversely varied in accordance with embodiments.

In exemplary embodiments, the upper transistors UT1 and UT2 may include a string selection transistor, whereas the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, respectively. The first and second gate upper lines UL1 and UL2 may be gate electrodes of the upper transistors UT1 and UT2, respectively.

In exemplary embodiments, the lower transistors LT1 and LT2 may include a lower erase control transistor LT1 and a ground selection transistor LT2 which are connected in series. The upper transistors UT1 and UT2 may include a string selection transistor UT1 and an upper erase control transistor UT2 which are connected in series. At least one of the lower erase control transistor LT1 and the upper erase control transistor UT1 may be used in an erase operation for deleting data stored in the memory cell transistors MCT using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 via first connecting lines 1115 extending from the inside of the first structure 1110F to the second structure 1100S. The bit lines BL may be electrically connected to the page buffer 1120 via second connecting lines 1125 extending from the inside of the first structure 1110F to the second structure 1100S.

In the first structure 1110F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 via an input/output connecting line 1135 extending from the inside of the first structure 1110F to the second structure 1100S.

The controller 1200 may include a processor 1210, a NAND controller 1220, and a host interface 1230. In accordance with embodiments, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host (not shown). Upon receiving a control command from an external host via the host interface 1230, the processor 1210 may control the semiconductor device 1100 in response to the control command.

Figure 30:
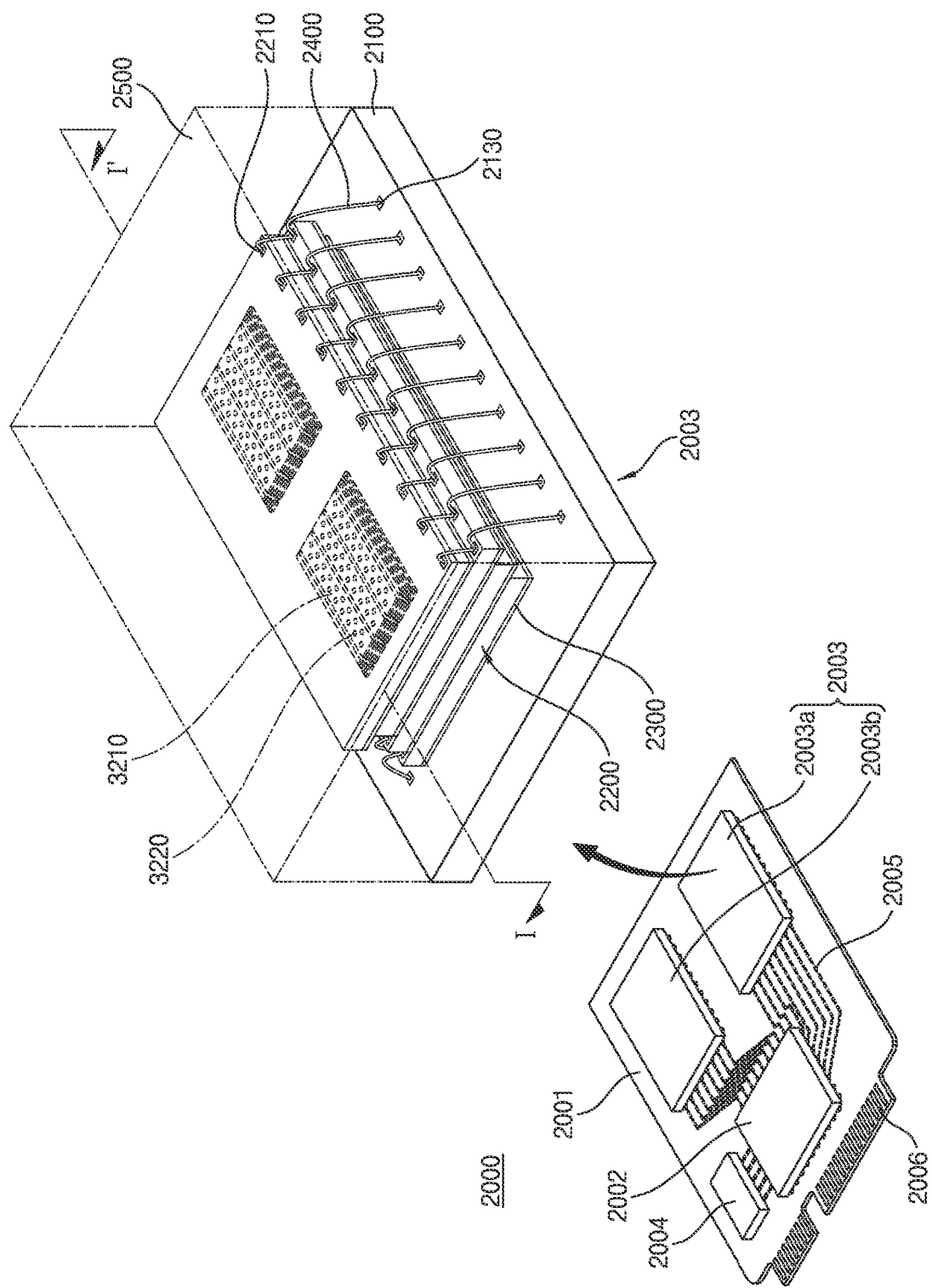
FIG. 30 illustrates a perspective view of an electronic system including semiconductor devices according to embodiments of the inventive concepts.

FIG. 30 illustrates a schematic perspective view of an electronic system including semiconductor devices according to embodiments of the inventive concepts.

Referring to FIG. 30, an electronic system 2000 according to embodiments of the inventive concepts may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host (not shown). The number and arrangement of the plurality of pins in the connector 2006 may be varied in accordance with a communication interface between the electronic system 2000 and the external host. In exemplary embodiments, the electronic system 2000 may communicate with the external host in accordance with any one of interfaces such as a universal serial bus (USB), peripheral component interconnect express (PCI-Express), serial advanced technology attachment (SATA), M-PHY for universal flash storage (UFS), etc. In exemplary embodiments, the electronic system 2000 may operate by power supplied from the external host via the connector 2006. The electronic system 2000 may further include a power management integrated circuit (PMIC) (not shown) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a kind of cache memory. The DRAM 2004 may provide a space for temporarily storing data in a control operation for the semiconductor package 2003. When the DRAM 2004 is included in the electronic system 2000, the controller 2002 may further include a DRAM controller (not shown) for controlling the DRAM 2004, in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, bonding layers 2300 respectively disposed at lower surfaces of the semiconductor chips 2200, a connecting structure 2400 for electrically interconnecting the semiconductor chips 2200 and the package substrate 2100, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 29. Each of the semiconductor chips 2200 may include gate stack structures 3210 and memory channel structures 3220. Each of the semiconductor chips 2200 may include a semiconductor device described with reference to FIGS. 1 to 28. For example, the gate stack structures 3210 may include the first and second stack structures ("55" and "65" in FIG. 1). The memory channel structures 3220 may include the plurality of channel structures ("70" in FIG. 1).

In exemplary embodiments, the connecting structure 2400 may be a bonding wire for electrically connecting the input/output pad 2210 and the package upper pads 2130. Accordingly, in each of the first and second semiconductor packages 2003a and 2003b, the semiconductor chips 2200 may be electrically interconnected through wire bonding, and may be electrically connected to the corresponding package upper pads 2130 of the package substrate 2100. In accordance with embodiments, in each of the first and second semiconductor packages 2003a and 2003b, the semiconductor chips 2200 may be electrically interconnected by a connecting structure including a through-silicon via (TSV) in place of the bonding wire type connecting structure 2400.

In exemplary embodiments, the controller 2002 and the semiconductor chips 2200 may be included in one package. In an exemplary embodiment, the controller 2002 and the semiconductor chips 2200 may be mounted on a separate interposer substrate different from the main substrate 2001. In this case, the controller 2002 and the semiconductor chips 2200 may be interconnected by wirings formed at the interposer substrate.

Figure 31:
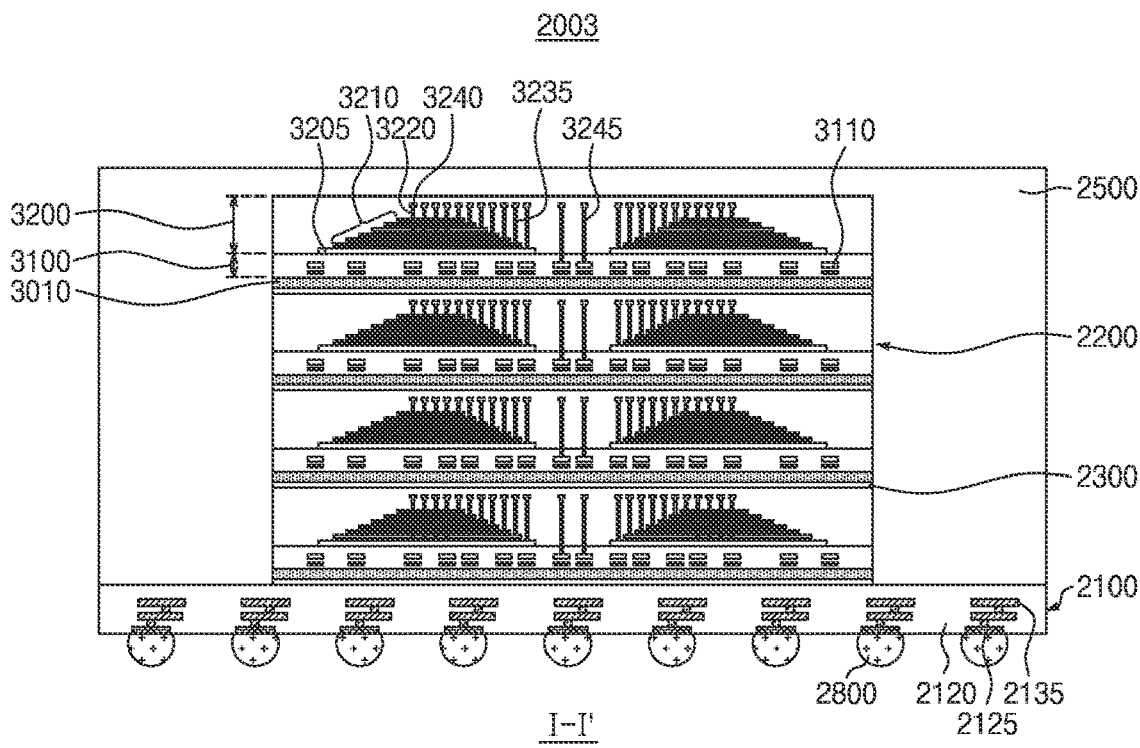
FIG. 31 illustrates a sectional view of a semiconductor package according to embodiments of the inventive concepts.
Figure 32:
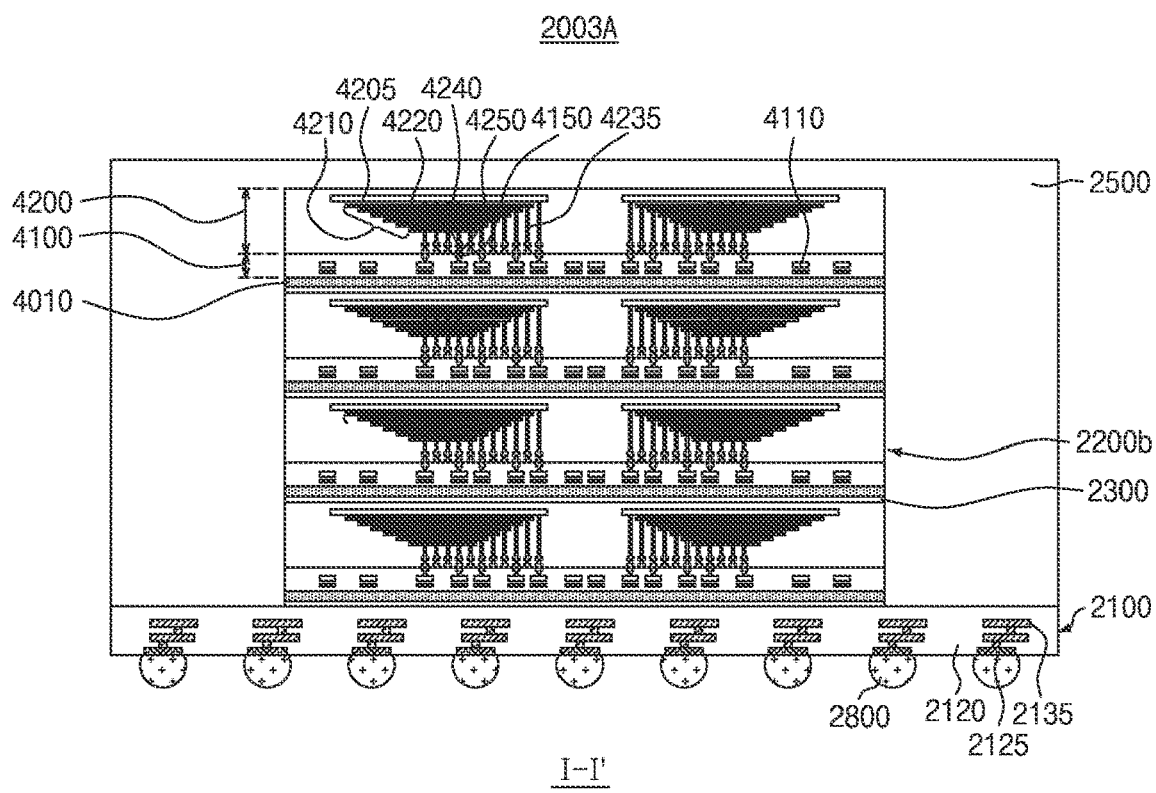
FIG. 32 illustrates a sectional view of a semiconductor package according to embodiments of the inventive concepts.

FIGS. 31 and 32 illustrate sectional views of semiconductor packages according to embodiments of the inventive concepts. Each of FIGS. 31 and 32 is explanatory of an exemplary embodiment of the semiconductor package 2003 of FIG. 30, and conceptually shows an area of the semiconductor package 2003 taken along line I-I' in FIG. 30.

Referring to FIG. 31, in the semiconductor package 2003 according to embodiments of the inventive concepts, the package substrate 2100 thereof may be a printed circuit board. The package substrate 2100 may include a package substrate body 2120, package upper pads ("2130" in FIG. 30) disposed at an upper surface of the package substrate body 2120, lower pads 2125 disposed at a lower surface of the package substrate body 2120 or exposed through the lower surface of the package substrate body 2120, and inner wirings 2135 electrically interconnecting the package upper pads ("2130" in FIG. 30) and the lower pads 2125 within the package substrate body 2120. The package upper pads ("2130" in FIG. 30) may be electrically connected to connecting structures ("2400" in FIG. 30). The lower pads 2125 may be connected to the wiring patterns 2005 of the main substrate 2001 of the electronic system 2000 through conductive connectors 2800, as shown in FIG. 30.

Each of the semiconductor chips 2200 may include a semiconductor substrate 3010, and a first structure 3100 and a second structure 3200 sequentially stacked on the semiconductor substrate 3010. The semiconductor chips 2200 may be bonded to each other by bonding layers 2300. The first structure 3100 may include a peripheral circuit region including peripheral wirings 3110. The second structure 3200 may include a common source line 3205, a gate stack structure 3210 on the common source line 3205, memory channel structures 3220 extending through the gate stack structure 3210, bit lines 3240 electrically connected to the memory channel structures 3220, and gate connecting wirings 3235 electrically connected to word lines ("WL" in FIG. 29) of the gate stack structure 3210.

In an embodiment, the first structure 3100 may include the plurality of transistors ("27" in FIG. 1) and the plurality of peripheral circuit wiring layers ("29" in FIG. 1). The common source line 3205 may include the horizontal wiring layer ("41" in FIG. 1). The gate stack structure 3210 may include the first and second stack structures ("55" and "65" in FIG. 1). The memory channel structures 3220 may include the plurality of channel structures ("70" in FIG. 1). The bit lines 3240 may include the plurality of bit lines ("87" in FIG. 1).

In an embodiment, each of the semiconductor chips 2200 may further include the plurality of alignment keys 83 and the plurality of protrusions 63P described with reference to FIGS. 1 to 28.

Each of the semiconductor chips 2200 may include a through wiring 3245 electrically connected to the peripheral wirings 3110 of the first structure 3100 while extending into the second structure 3200. Each of the semiconductor chips 2200 may be electrically connected to the peripheral wirings 3110 of the first structure 3100. The through wiring 3245 may be disposed outside the gate stack structure 3210, and may be further disposed to extend through the gate stack structure 3210. Each of the semiconductor chips 2200 may further include an input/output pad ("2210" in FIG. 30) electrically connected to the peripheral wirings 3110 of the first structure 3100. The molding layer 2500 may cover the semiconductor chips 2200 and the package substrate 2100.

Referring to FIG. 32, in a semiconductor package 2003A according to embodiments of the inventive concepts, each of semiconductor chips 2200b thereof may include a semiconductor substrate 4010, a first structure 4100 on the semiconductor substrate 4010, and a second structure 4200 bonded to the first structure 4100 in a wafer bonding manner on the first structure 4100.

The first structure 4100 may include a peripheral circuit region including a peripheral wiring 4110 and first bonding structures 4150. The second structure 4200 may include a common source line 4205, a gate stack structure 4210 between the common source line 4205 and the first structure 4100, memory channel structures 4220 extending through the gate stack structure 4210, and second bonding structures 4250 electrically connected to the memory channel structures 4220 and word lines of the gate stack structure 4210 ("WL" in FIG. 29), respectively. For example, the second bonding structures 4250 may be electrically connected to the memory channel structures 4220 and the word lines ("WL" in FIG. 29) through bit lines 4240 electrically connected to the memory channel structures 4220 and gate connecting wirings 4235 electrically connected to the word lines ("WL" in FIG. 29), respectively. The first bonding structures 4150 of the first structure 4100 and the second bonding structures 4250 of the second structure 4200 may be bonded to each other while contacting each other. Bonding portions of the first bonding structures 4150 and the second bonding structures 4250 may be made of, for example, copper (Cu).

In an embodiment, the first structure 4100 may include the plurality of transistors ("27" in FIG. 8) and the plurality of peripheral circuit wiring layers ("29" in FIG. 8). The common source line 4205 may include the horizontal wiring layer ("41" in FIG. 8). The gate stack structure 4210 may include the first and second stack structures ("55" and "65" in FIG. 8). The memory channel structures 4220 may include the plurality of channel structures ("70" in FIG. 8). The bit lines 4240 may include the plurality of bit lines ("87" in FIG. 8).

In an embodiment, each of the semiconductor chips 2200b may further include the plurality of alignment keys 83 and the plurality of protrusions 63P described with reference to FIGS. 1 to 28. In an embodiment, each of the semiconductor chips 2200b may further include an input/output pad ("2210" in FIG. 30) electrically connected to the peripheral wirings 4110 of the first structure 4100.

The semiconductor chips 2200 of FIG. 31 and the semiconductor chips 2200b of FIG. 32 may be electrically connected by bonding wire type connecting structures ("2400" in FIG. 30). In an embodiment, semiconductor chips in one semiconductor package such as the semiconductor chips 2200 of FIG. 31 and the semiconductor chips 2200b of FIG. 32 may be electrically interconnected by a connecting structure including a through-silicon via (TSV).

In accordance with the embodiments of the inventive concepts, a channel structure disposed in a first channel hole and a second channel hole, an alignment key protruding to a higher level than an uppermost end of a first auxiliary stack structure while extending through the first auxiliary stack structure, and a second auxiliary stack structure including a protrusion aligned on the alignment key may be provided. A process for aligning the second channel hole with the first channel hole may be efficiently performed by virtue of the protrusion and the alignment key. Semiconductor devices including a multilayer structure and an electronic system including the semiconductor devices may be realized.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

While embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A semiconductor device comprising:
   a first stack structure comprising a plurality of first insulating layers and a plurality of first wiring layers repeatedly and alternately stacked on a substrate;
   a second stack structure comprising a plurality of second insulating layers and a plurality of second wiring layers repeatedly and alternately stacked on the first stack structure;
   a first channel hole extending through the first stack structure;
   a second channel hole extending through the second stack structure and communicating with the first channel hole;
   a channel structure in the first channel hole and the second channel hole;
   a first auxiliary stack structure comprising the plurality of first insulating layers and a plurality of first mold layers repeatedly and alternately stacked on the substrate;
   an alignment key extending into the first auxiliary stack structure and protruding to a higher level than an uppermost end of the first stack structure; and
   a second auxiliary stack structure disposed on the first auxiliary stack structure and the alignment key, the second auxiliary stack structure comprising the plurality of second insulating layers and a plurality of second mold layers repeatedly and alternately stacked,
   wherein the second auxiliary stack structure comprises a protrusion aligned with the alignment key, and
   wherein an uppermost end of the protrusion protrudes to a higher level than an uppermost end of the second stack structure.

2. The semiconductor device according to claim 1, wherein a minimum distance between an uppermost end of the alignment key and a lower surface of the substrate is greater than a minimum distance between the uppermost end of the first stack structure and the lower surface of the substrate.

3. The semiconductor device according to claim 1, wherein a minimum distance between an uppermost end of the alignment key and a lower surface of the substrate is greater than a minimum distance between an uppermost end of the first channel hole and the lower surface of the substrate.

4. The semiconductor device according to claim 1, wherein a minimum distance between the uppermost end of the protrusion and a lower surface of the substrate is greater than a minimum distance between the uppermost end of the second stack structure and the lower surface of the substrate.

5. The semiconductor device according to claim 1, wherein a minimum distance between the uppermost end of the protrusion and a lower surface of the substrate is greater than a minimum distance between an uppermost end of the channel structure and the lower surface of the substrate.

6. The semiconductor device according to claim 1, wherein:
   the first auxiliary stack structure has substantially a same thickness as the first stack structure; and
   the second auxiliary stack structure has substantially a same thickness as the second stack structure.

7. The semiconductor device according to claim 1, wherein a minimum distance between a lowermost end of the alignment key and a lower surface of the substrate is substantially equal to a minimum distance between a lowermost end of the channel structure and the lower surface of the substrate.

8. The semiconductor device according to claim 1, wherein the alignment key comprises a polysilicon layer, a W layer, a silicon nitride layer, or a combination thereof.

9. The semiconductor device according to claim 1, wherein the alignment key comprises a buried layer, and a liner surrounding a side surface and a bottom of the buried layer, and
   the liner comprises a material different from a material of the buried layer.

10. The semiconductor device according to claim 9, wherein the buried layer comprises polysilicon, and the liner comprises silicon nitride.

11. The semiconductor device according to claim 1, wherein, in a region adjacent to a boundary between the first channel hole and the second channel hole, a horizontal width of the second channel hole is smaller than a horizontal width of the first channel hole.

12. The semiconductor device according to claim 1, wherein a difference between a minimum distance between an uppermost end of the alignment key and a lower surface of the substrate, and a minimum distance between the uppermost end of the first stack structure and the lower surface of the substrate is 1 to 100 nm.

13. The semiconductor device according to claim 1, wherein a difference between a minimum distance between an uppermost end of the alignment key and a lower surface of the substrate, and a minimum distance between the uppermost end of the first stack structure and the lower surface of the substrate is about 50 nm.

14. The semiconductor device according to claim 1, wherein the plurality of first insulating layers and the plurality of second insulating layers comprise silicon oxide, and the plurality of first mold layers and the plurality of second mold layers comprise silicon nitride.

15. A semiconductor device comprising:
   a substrate comprising a first area, and a second area spaced apart from the first area;
   a first stack structure comprising a plurality of first insulating layers and a plurality of first wiring layers repeatedly and alternately stacked in the first area on a substrate;
   a second stack structure comprising a plurality of second insulating layers and a plurality of second wiring layers repeatedly and alternately stacked on the first stack structure;
   a first channel hole extending through the first stack structure;
   a second channel hole extending through the second stack structure and communicating with the first channel hole;
   a channel structure in the first channel hole and the second channel hole;
   a bit line on the channel structure;
   a first auxiliary stack structure comprising the plurality of first insulating layers and a plurality of first mold layers repeatedly and alternately stacked in the second area on the substrate;
   an alignment key extending into the first auxiliary stack structure and protruding to a higher level than an uppermost end of the first stack structure; and
   a second auxiliary stack structure disposed on the first auxiliary stack structure and the alignment key, the second auxiliary stack structure comprising the plurality of second insulating layers and a plurality of second mold layers repeatedly and alternately stacked,
   wherein the second auxiliary stack structure comprises a protrusion aligned with the alignment key, and wherein an uppermost end of the protrusion protrudes to a higher level than an uppermost end of the second stack structure.

16. The semiconductor device according to claim 15, further comprising:
a horizontal wiring layer disposed in the first area on the substrate;
a sealing conductive layer on the horizontal wiring layer;
a support on the sealing conductive layer;
a horizontal buried layer disposed in the second area on the substrate; and
an interlayer insulating layer on the horizontal buried layer,
wherein the first stack structure is disposed on the support,
wherein the channel structure extends into the horizontal wiring layer and through the second stack structure, the first stack structure, the support, and the sealing conductive layer,
wherein the first auxiliary stack structure is disposed on the interlayer insulating layer, and
wherein the alignment key extends into the horizontal buried layer and through the first auxiliary stack structure and the interlayer insulating layer.

17. The semiconductor device according to claim 16, wherein an interface between the first stack structure and the support is substantially coplanar with an interface between the first auxiliary stack structure and the interlayer insulating layer.

18. The semiconductor device according to claim 16, wherein the horizontal wiring layer comprises a material different from a material of the horizontal buried layer.

19. An electronic system comprising:
a main substrate;
a semiconductor device on the main substrate; and
a controller electrically connected to the semiconductor device on the main substrate,
wherein the semiconductor device comprises
a substrate comprising a first area, and a second area spaced apart from the first area,
a first stack structure comprising a plurality of first insulating layers and a plurality of first wiring layers repeatedly and alternately stacked in the first area on a substrate,
a second stack structure comprising a plurality of second insulating layers and a plurality of second wiring layers repeatedly and alternately stacked on the first stack structure,
a first channel hole extending through the first stack structure,
a second channel hole extending through the second stack structure and communicating with the first channel hole,
a channel structure in the first channel hole and the second channel hole,
a bit line on the channel structure,
a first auxiliary stack structure comprising the plurality of first insulating layers and a plurality of first mold layers repeatedly and alternately stacked in the second area on the substrate,
an alignment key extending into the first auxiliary stack structure and protruding to a higher level than an uppermost end of the first stack structure, and
a second auxiliary stack structure disposed on the first auxiliary stack structure and the alignment key, the second auxiliary stack structure comprising the plurality of second insulating layers and a plurality of second mold layers repeatedly and alternately stacked,
wherein the second auxiliary stack structure comprises a protrusion aligned with the alignment key, and
wherein an uppermost end of the protrusion protrudes to a higher level than an uppermost end of the second stack structure.

20. The electronic system according to claim 19, wherein the main substrate further comprises wiring patterns electrically interconnecting the semiconductor device and the controller, and
the semiconductor device further comprises
a horizontal wiring layer disposed in the first area on the substrate,
a sealing conductive layer on the horizontal wiring layer,
a support on the sealing conductive layer,
a horizontal buried layer disposed in the second area on the substrate, and
an interlayer insulating layer on the horizontal buried layer,
wherein the first stack structure is disposed on the support,
the channel structure extends into the horizontal wiring layer and through the second stack structure, the first stack structure, the support, and the sealing conductive layer;
the first auxiliary stack structure is disposed on the interlayer insulating layer, and
the alignment key extends into the horizontal buried layer and through the first auxiliary stack structure and the interlayer insulating layer.

\* \* \* \* \*